(12) United States Patent
Le Taillandier De Gabory et al.

(10) Patent No.: US 11,374,377 B2
(45) Date of Patent: Jun. 28, 2022

(54) OPTICAL AMPLIFYING APPARATUS AND METHOD OF AMPLIFYING OPTICAL SIGNAL

(71) Applicant: NEC CORPORATION, Tokyo (JP)

(72) Inventors: Emmanuel Le Taillandier De Gabory, Tokyo (JP); Shigeyuki Yanagimachi, Tokyo (JP); Shigeru Nakamura, Tokyo (JP); Keiichi Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 299 days.

(21) Appl. No.: 16/606,290

(22) PCT Filed: Apr. 20, 2017

(86) PCT No.: PCT/JP2017/015919
§ 371 (c)(1),
(2) Date: Oct. 18, 2019

(87) PCT Pub. No.: WO2018/193587
PCT Pub. Date: Oct. 25, 2018

(65) Prior Publication Data
US 2021/0194218 A1      Jun. 24, 2021

(51) Int. Cl.
*H01S 5/04*      (2006.01)
*H01S 3/094*     (2006.01)
(Continued)

(52) U.S. Cl.
CPC ...... *H01S 3/094061* (2013.01); *H01S 3/1001* (2019.08); *H01S 5/0261* (2013.01);
(Continued)

(58) Field of Classification Search
CPC .. H01S 3/094061; H01S 5/0261; H01S 5/041; H01S 5/4025; H01S 5/5018;
(Continued)

(56) References Cited

U.S. PATENT DOCUMENTS 5,546,484 A * 8/1996 Fling ...................... G02B 6/283
                                                       385/16
5,740,288 A * 4/1998 Pan ....................... G02B 6/2773
                                                       385/11
(Continued)

FOREIGN PATENT DOCUMENTS

EP      2131509 B1    8/2014
ER      3029860 A1    6/2016
(Continued)

OTHER PUBLICATIONS

International Search Report for PCT/JP2017/015919 dated, Jul. 11, 2017 (PCT/ISA/210).
(Continued)

*Primary Examiner* — Xinning(Tom) Niu

(57) ABSTRACT

It is necessary to reduce the power consumption of a plurality of optical amplifiers when there is a difference in the required pumping power between the plurality of optical amplifiers; therefore, an optical amplifying apparatus according to an exemplary aspect of the invention includes a plurality of optical amplifying means for amplifying a plurality of optical signals, each of the plurality of optical amplifying means including a gain medium; a plurality of laser light generating means for generating a plurality of laser beams; at least one optical coupling means for coupling the plurality of laser beams variably in accordance with a coupling factor and outputting a plurality of excitation light beams, each of the plurality of excitation light beams exciting the gain medium; and controlling means for controlling the coupling factor and an output power of each of the plurality of laser light generating means.

20 Claims, 16 Drawing Sheets

(51) Int. Cl.
*H01S 3/10* (2006.01)
*H01S 5/026* (2006.01)
*H01S 5/40* (2006.01)
*H01S 5/50* (2006.01)

(52) U.S. Cl.
CPC ............ *H01S 5/041* (2013.01); *H01S 5/4025* (2013.01); *H01S 5/5018* (2013.01)

(58) Field of Classification Search
CPC .. H01S 3/1001; H01S 3/06754; H01S 3/2383; H01S 3/10069; H01S 3/13013; H01S 3/09408; H01S 3/094007; H01S 3/09415; H01S 3/10015; H01S 3/1608; H01S 3/06737; H04B 10/2581; H04B 10/2931; G02B 6/02042
See application file for complete search history.

(56) References Cited

U.S. PATENT DOCUMENTS

| | | | | |
|---|---|---|---|---|
| 2002/0060837 | A1* | 5/2002 | Inagaki | H01S 3/1301 359/337 |
| 2009/0201576 | A1* | 8/2009 | Bolshtyansky | H01S 3/06754 359/341.33 |
| 2013/0222890 | A1 | 8/2013 | Sakauchi | |
| 2015/0263477 | A1* | 9/2015 | Onaka | H01S 3/1305 372/6 |
| 2016/0299293 | A1 | 10/2016 | Iida et al. | |

FOREIGN PATENT DOCUMENTS

| | | | |
|---|---|---|---|
| JP | 4-003029 | A | 1/1992 |
| JP | 5-136495 | A | 6/1993 |
| JP | 2003-318837 | A | 11/2003 |
| JP | 4003029 | B2 * | 11/2007 |
| JP | 2013-123205 | | * 6/2013 |
| JP | 2013-123205 | A | 6/2013 |
| JP | 2015-167158 | A | 9/2015 |
| WO | 2012/053320 | A1 | 4/2012 |
| WO | 2016/047233 | A1 | 3/2016 |
| WO | 2017/056438 | A1 | 4/2017 |

OTHER PUBLICATIONS

Written Opinion of the International Searching Authority for PCT/JP2017/015919 dated, Jul. 11, 2017 (PCT/ISA/237).
Communication dated Mar. 20, 2020, from the European Patent Office in European Application No. 17906389.6.

* cited by examiner

OPTICAL AMPLIFYING APPARATUS AND METHOD OF AMPLIFYING OPTICAL SIGNAL

CROSS REFERENCE TO RELATED APPLICATIONS

This application is a National Stage of International Application No. PCT/JP2017/015919 filed Apr. 20, 2017.

TECHNICAL FIELD

The present invention relates to optical amplifying apparatuses and methods of amplifying an optical signal, in particular, to an optical amplifying apparatus and a method of amplifying an optical signal that use a plurality of gain mediums.

BACKGROUND ART

In order to optimize the investment in optical fiber links, it is desirable to increase the capacity of the optical fiber links. This can be achieved by increasing the spectral efficiency (SE) of the signals to be transmitted through the optical fiber links.

A common way to achieve the increase in the SE is to use more efficient modulation formats for the information to be transmitted. This can be used in conjunction with the wavelength division multiplexing (WDM) system.

Furthermore, the space division multiplexing (SDM) system is being used in order to increase the capacity of transmission through a single fiber maintaining the possibility of the transmission over a long distance.

The SDM system can be implemented with a multi core fiber (MCF) and a multicore (MC) erbium doped fiber amplifier (EDFA). The MCF includes several cores conducting optical signals within the same fiber. The MC-EDFA is a fiber amplifier with an MCF as a gain medium (see Patent Literature 1, for example). The MC-EDFA consists in pumping individually the core of a single MCF gain medium with separate pumping lasers by a scheme of direct core pumping. The MC-EDFA system demonstrates the possibility to multiply the system capacity by the number of cores of the MCF. By using the MCF, it is possible to use the multiplicity of cores to spatially multiplex signals in addition to the WDM in each core and to increase the capacity to be transmitted through fibers without sacrificing the transmission distance.

In addition, a reduction in the power consumption of optical amplification is being pursued actively. The reduction in the power consumption at amplifiers is of primary importance for the system scalable to very high capacity and for the reduction in operation expenditure (OPEX) through the reduction in electricity consumed.

Several schemes have been proposed for standard WDM systems and even for systems using the SDM technology taking advantage of the spatial multiplicity.

Patent Literature 2 (PTL2) discloses an optical amplification system that includes an excitation light distribution unit, gain block units, and a node device control unit.

The excitation light distribution unit includes an excitation laser light source unit, a variable branching unit, and an excitation light distribution control unit. The variable branching unit branches excitation light that is outputted by the excitation laser light source unit and distributes the branched light to the gain block units.

Each of the gain block units combines the excitation light distributed from the variable branching unit and an optical signal inputted from the corresponding route by using a coupler, and then amplifies the optical signal with an amplification medium. Each of the gain block units includes an active fiber such as an Erbium doped fiber (EDF), isolators, photodetectors, a variable optical attenuator (VOA), an individual gain block control unit, and optical couplers.

The individual gain block control unit controls the VOA based on monitoring information of the photodetectors at respective sections. By controlling the VOA, the individual gain block control unit in each gain block can change excitation light power inputted to the active fiber.

The optical amplification system of PTL2 does not need to include an excitation light source for each gain block, and can reduce the number of arranged excitation light sources by integrating the excitation light sources. It is said that, as a result, the optical amplification system of PTL2 leads to the effect of reducing the cost and power consumption of an optical amplification system provided with optical amplifiers.

Another example of the SDM system is described in Patent Literature 3 (PTL3). A fiber type optical amplifier described in PTL3 has a redundant structure including two amplifying mediums and two excitation light sources.

In the fiber type optical amplifier described in PTL3, excitation light waves outputted by excitation light sources are polarized by wave polarization controllers, and they are inputted into a multi/demultiplexer with a polarization state normal to each other. After the polarization synthesis, they are distributed and inputted into rare-earth doped optical fibers through wavelength multiplexing multi/demultiplexers.

According to the fiber type optical amplifier described in PTL3, it is said that it becomes possible to constitute a fiber type optical amplifier without level variations caused by the synthesis of the two excitation-light beams.

CITATION LIST

Patent Literature

[PTL 1] Japanese Patent Application Laid-Open Publication No. 2015-167158
[PTL 2] WO 2012/053320
[PTL 3] Japanese Patent Application Laid-Open Publication No. 05-136495

SUMMARY OF INVENTION

Technical Problem

It is difficult to reduce the power consumption of the optical amplification by using common pumping among more than one EDFAs. The main difficulties consist in the structure of the amplifier and taking into account the difference in the required pumping power between EDFAs. For instance, the differences between EDFAs in the required pumping power may result from different device tolerances, or the aging of the amplifier or the transmission line to which the amplifier is connected. In addition, the differences between EDFAs in the required pumping power may originate from different optical bandwidth or the number of WDM channels amplified by the different EDFA. Furthermore, considering the phenomena associated with the aging of the dynamic bandwidth reconfiguration, the levels of the required pumping power between EDFAs will change during the lifetime of the amplifiers.

As mentioned above, the fiber type optical amplifier described in PTL3 uses pump-sharing techniques where the pumping power is split between EDFAs using optical couplers with fixed ratio. However, when the fiber amplification medium of the EDFA or the transmission fiber ages, or the transmission fiber is repaired in field by splicing, the required pumping power between EDFAs varies. Such a structure cannot change the distribution of the optical pumping power between EDFAs; therefore, the same power as the maximum required pumping power is distributed between EDFAs, and the output power of EDFA requiring less power has to be reduced afterwards. This causes inefficient power and additional power consumption. The same phenomenon occurs when one EDFA is amplifying significantly more WDM channels than another is. This will happen for different routes in traffic, through which optical signals amplified by EDFA are transmitted.

In addition, the fiber type optical amplifier described in PTL3 includes two amplifiers and two pump lasers. The output beams of the pump lasers are combined in polarization and then split between two fiber amplifiers. The output beams of the two pump lasers are controlled in polarization before being combined in order to minimize their interference. However, the polarization of the combined output beams cannot be controlled. Consequently, only the respective levels of the laser diodes can be controlled. The pumping power to be supplied to the fiber amplifiers cannot be adjusted independently; therefore, the power consumption of the amplifier cannot be reduced.

In the optical amplification system disclosed in PTL2, the excitation light power inputted into the active fiber can be changed in each gain block by controlling the variable optical attenuator (VOA), as mentioned above. However, the use of the VOA causes unnecessary light to be generated by the excitation laser light source unit.

As mentioned above, there has been the problem that it is necessary to reduce the power consumption of a plurality of optical amplifiers when there is a difference in the required pumping power between the plurality of optical amplifiers.

An exemplary object of the invention is to provide an optical amplifying apparatus and a method of amplifying an optical signal, which solve the above-mentioned problem that it is necessary to reduce the power consumption of a plurality of optical amplifiers when there is a difference in the required pumping power between the plurality of optical amplifiers.

Solution to Problem

An optical amplifying apparatus according to an exemplary aspect of the invention includes a plurality of optical amplifying means for amplifying a plurality of optical signals, each of the plurality of optical amplifying means including a gain medium; a plurality of laser light generating means for generating a plurality of laser beams; at least one optical coupling means for coupling the plurality of laser beams variably in accordance with a coupling factor and outputting a plurality of excitation light beams, each of the plurality of excitation light beams exciting the gain medium; and controlling means for controlling the coupling factor and an output power of each of the plurality of laser light generating means.

A method of amplifying an optical signal according to an exemplary aspect of the invention includes generating a plurality of laser beams; coupling the plurality of laser beams variably in accordance with a coupling factor and generating a plurality of excitation light beams; exciting, by the plurality of excitation light beams, a plurality of gain mediums through which a plurality of optical signals passing; and controlling the coupling factor and an output power of each of the plurality of laser beams.

Advantageous Effects of Invention

An exemplary advantage according to the present invention is that it is possible to reduce the power consumption of a plurality of optical amplifiers even when there is a difference in the required pumping power between the plurality of optical amplifiers.

DESCRIPTION OF EMBODIMENTS

Figure 1:
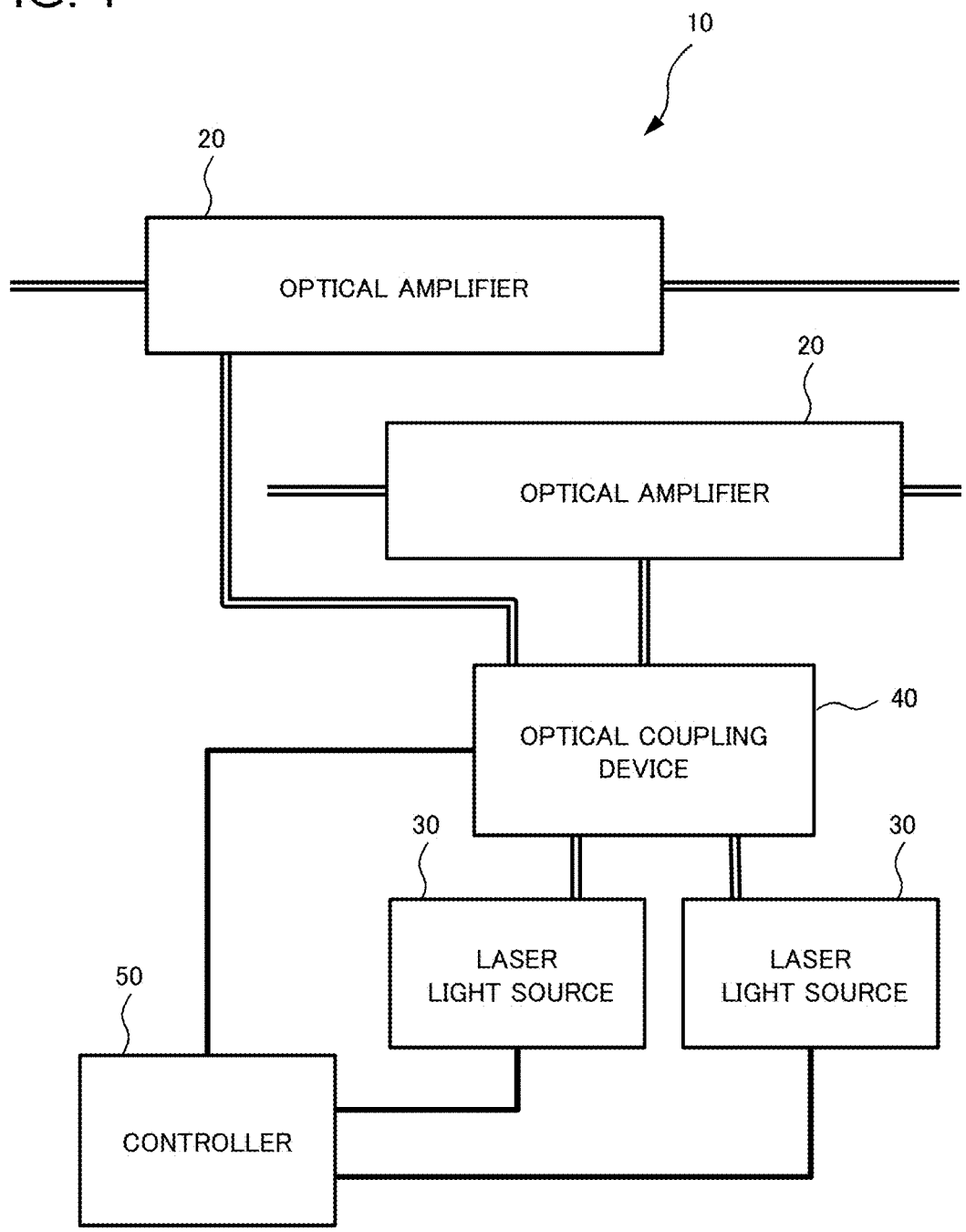
FIG. 1 is a block diagram illustrating the configuration of an optical amplifying apparatus in accordance with a first exemplary embodiment of the present invention.

The example embodiments of the present invention will be described with reference to drawings below. The arrow direction in the drawings denotes an example of direction and does not limit the direction of signals between blocks.

A First Example Embodiment

FIG. 1 is a block diagram illustrating the configuration of an optical amplifying apparatus in accordance with a first example embodiment of the present invention. The optical amplifying apparatus 10 includes a plurality of optical amplifiers (optical amplifying means) 20, a plurality of laser light sources (laser light generating means) 30, at least one optical coupling device (optical coupling means) 40, and a controller (controlling means) 50.

The plurality of optical amplifiers 20 amplifies a plurality of optical signals. Each of the plurality of optical amplifiers 20 includes a gain medium. The plurality of laser light sources 30 generates a plurality of laser beams.

At least one optical coupling device 40 couples the plurality of laser beams variably in accordance with a coupling factor and outputs a plurality of excitation light beams. Each of the plurality of excitation light beams excites the gain medium. The controller 50 controls the coupling factor and an output power of each of the plurality of laser light sources 30.

As mentioned above, the optical amplifying apparatus 10 according to the present example embodiment includes the plurality of laser light sources 30, and the optical coupling device 40 included in the optical amplifying apparatus 10 couples the plurality of laser beams variably in accordance with the coupling factor. As a result, it is possible to reduce the power consumption of a plurality of optical amplifiers even when there is a difference in the required pumping power between the plurality of optical amplifiers.

The at least one optical coupling device 40 may include a plurality of optical coupling devices. In this case, the controller 50 can control the coupling factor of each of the plurality of optical coupling devices.

The gain medium can be a core included in a multicore fiber. In this case, each of the plurality of laser light sources 30 can directly excite the gain medium by each of the plurality of excitation light beams.

Alternatively, the gain medium can be a multicore fiber. In this case, each of the plurality of laser light sources 30 can excite the gain medium by pumping a clad of the multicore fiber. Each of the plurality of excitation light beams can be a multimode light beam.

In addition, the number of the plurality of optical amplifiers 20 represented by positive integer N, the number of the at least one optical coupling device 40 represented by positive integer M, and the number of the plurality of laser light sources 30 represented by positive integer L can satisfy the following relational expressions:

$N \geq 2,$ $(N/2) \leq M \leq (N^2/4),$ and $L \leq 2 \times M.$

In this case, a relational expression of $L=N=M^2/4$ can be satisfied. Alternatively, a relational expression of $L=N=M/2$ can be satisfied.

Next, a method of amplifying an optical signal in accordance with the present example embodiment will be described.

In the method of amplifying an optical signal, a plurality of laser beams is generated. The plurality of laser beams is coupled variably in accordance with a coupling factor, by which a plurality of excitation light beams is generated. By the plurality of excitation light beams, a plurality of gain mediums through which a plurality of optical signals pass is excited.

In addition, the coupling factor and an output power of each of the plurality of laser beams are controlled.

As mentioned above, according to the optical amplifying apparatus 10 and the method of amplifying an optical signal according to the present example embodiment, it is possible to reduce the power consumption of a plurality of optical amplifiers even when there is a difference in the required pumping power between the plurality of optical amplifiers.

A Second Example Embodiment

Next, a second example embodiment of the present invention will be described.

Figure 2:
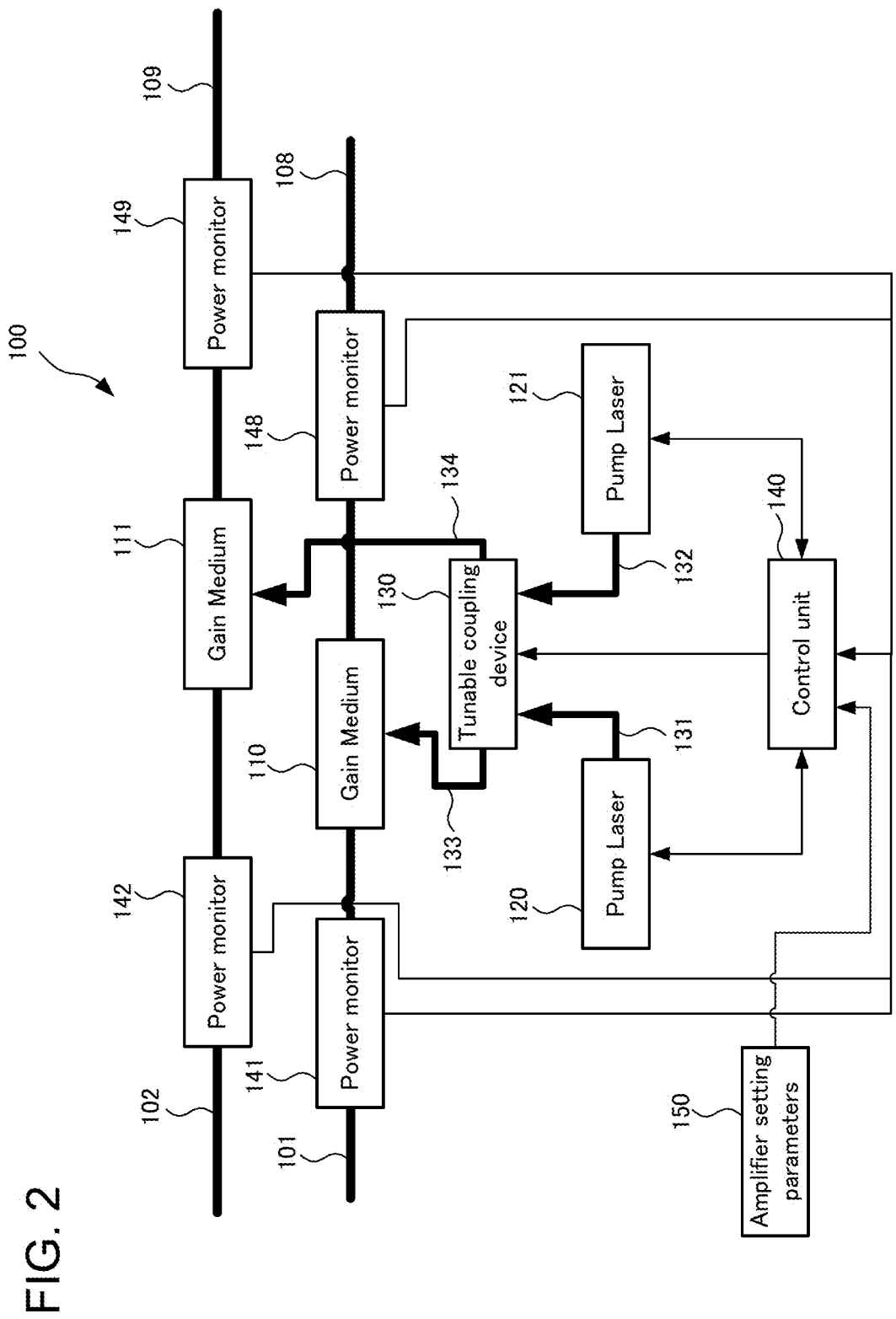
FIG. 2 is a block diagram illustrating the configuration of an optical amplifying apparatus in accordance with a second example embodiment of the present invention.

FIG. 2 is a block diagram illustrating the configuration of an optical amplifying apparatus 100 in accordance with the second example embodiment of the present invention. The optical amplifying apparatus 100 includes two optical amplifiers. The two optical amplifiers are composed of respective gain mediums 110 and 111. Each of the gain mediums 110 and 111 may be made of an Erbium doped single mode fiber. The optical amplifier may include an isolator, a WDM coupler, and an equalization filter.

The gain medium 110 amplifies an optical signal that is provided through an optical fiber 101 and that has passed through a power monitor 141. The power monitor 141 taps a small portion of the light coming from the optical fiber 101 and converts it into an electrical monitor signal using a photodiode. Typically, the power monitor 141 may tap 1% of the light to be inputted into the gain medium 110 in order to monitor the incoming optical power by the generated electrical monitor signal. Similarly, a power monitor 148 generates an electrical monitor signal that depends on the output optical power of the gain medium 110. The optical signal amplified by the gain medium 110 and monitored by the monitor 148 is output to an optical fiber 108.

Identically, the gain medium 111 amplifies an optical signal that is inputted from an optical fiber 102 and monitored by a power monitor 142. The optical signal amplified by the gain medium 111 is monitored by a power monitor 149 and output to an optical fiber 109.

The pumping light for optical amplification through the respective gain mediums 110 and 111 is provided through respective fibers 133 and 134. The pumping light beams are output from a tunable coupling device 130. The tunable coupling device 130 has two input ports to which respective fibers 131 and 132 are connected. The fibers 131 and 132 are connected to the outputs of respective pump lasers 120 and 121.

The respective optical powers in the respective fibers 131, 132, 133, and 134 are represented by $P_{131}$, $P_{132}$, $P_{133}$, and $P_{134}$. If the coupling factor of the tunable coupling device 130 is represented by C, and the transmission factor is represented by T, the relation between the powers becomes typically as follows:

$$\begin{cases} P_{133} = T \times (C \cdot P_{131} + (1-C)P_{132}) \\ P_{134} = T \times (C \cdot P_{132} + (1-C)P_{131}) \end{cases}$$

The transmission factor T is high for low loss devices, typically above 0.98. The coupling factor C is controlled for the tunable coupling device 130, and it is tuned between 0 and 1. The powers $P_{131}$ and $P_{132}$ are the respective output powers of the respective pump lasers 120 and 121. The pumping power provided to the respective gain mediums 110 and 111 are the respective powers $P_{133}$ and $P_{134}$.

A control unit 140 controls the pump lasers 120 and 121 as well as the coupling factor C of the tunable coupling device of 130. The control is performed according to amplifier setting parameters provided by an interface 150, according to operating information of the pump lasers 120 and 121, and according to power monitor information provided by the power monitors 141, 142, 148, and 149.

The control according to the output powers of the monitors 148 and 149 is performed individually for the two gain mediums 110 and 111. The control of the pump lasers 120 and 121 is performed individually depending on the monitored values and the amplifier setting parameters; consequently, one of the pump lasers may be turned off. In this case, the control unit 140 stores the updated operation values, and the control is performed according to the last stored values for the pump laser that is turned off.

Alternatively, the control unit 140 may perform the control uniquely according to the amplifier setting parameters provided by the interface 150, according to the operating information of the pump lasers 120 and 121, and according to power monitor information provided by the power monitors 148 and 149. In this case, the information provided by the power monitors 141 and 142 is not used for the control.

The two amplifiers that include two gain mediums 110, 111, and are controlled by the control unit 140 are typically placed in the same location, so that the loss for transmitting the pumping power through short-distance fibers is negligible. The two fibers with respective optical fibers 101, 102 for input and respective optical fibers 108, 109 for output may be configured in unidirectional manner.

Alternatively, the fibers may be configured in bidirectional manner, in which respective optical fibers 101, 109 are fibers for input, and respective optical fibers 108, 102 are fibers for output. In this case, the power monitor 142 monitors the output power of the gain medium 111, and the power monitor 149 monitors the input power to the same gain medium. The gain medium and components attached to it such as an isolator and a WDM coupler are configured according to the propagation direction of the optical signal.

According to the control by the control unit 140, the pumping light beams of the pump lasers 120 and 121 are shared by the tunable coupling device 130. The output of the pump lasers 120 and 121 is set for minimum power consumption of the pump lasers 120 and 121.

According to the control by the control unit 140, the amplification by the gain medium 110 and 111 does not require more pumping power than necessary. The control is still valid when the input signals in the optical fibers 101 and 102 are reduced, or when the required output powers increase.

According to the present example embodiment, the power consumption of two optical amplifiers including the gain mediums 110, 111 is reduced during the lifetime of the amplifiers. The reduction in power consumption is effective in the ageing of the system that causes the differences in the required optical pumping power, when the amplifiers are used for different bandwidths, or when the bandwidth changes over the lifetime of a network.

In a specific configuration of FIG. 2, each of the pump lasers 120 and 121 is an identical type of laser. Their characteristics are similar. If the required total pumping power for the gain mediums 110 and 111 is moderate, the control unit 140 turns off either, uses the other one to generate the total pumping power, and configures the tunable coupling device 130 to share the pumping light adequately among the gain mediums 110 and 111. For instance, the pump laser 120 will be on, and the pump laser 121 will be turned off. If the characteristics of the laser 120 degrade due to ageing, the efficiency of the laser 121 that is not used will be superior; consequently, the control unit 140 will gradually turn the laser 121 on and use more power from it. According to their relative efficiency and the required pumping power for the gain mediums 110 and 111, the pump laser 120 may be turned off, and the pumping power may be generated by the laser 121 only. The control unit 140 controls adequately the tunable coupling device 130.

Alternatively, the pump laser 120 is a laser capable of outputting very high pumping power, and the pump laser 121 is a laser capable of outputting moderate laser power only. That is, the pump laser 120 and the pump laser 121 are more than one type of lasers and have different specifications. For instance, the laser 120 may be a cooled pump laser, and the laser 121 may be an uncooled pump laser. Depending on the package and the chip structure, the laser 121 will have a better efficiency.

If the bandwidth of the optical signal to be amplified by the gain mediums 110 and 111 is limited, low pumping power only will be required. In this case, the control unit 140 will turn on the pump laser 121 only, and the pump laser 120 will be turned off. The tunable coupling device 130 will be configured adequately by the control unit 140.

If the bandwidth of the optical signal to be amplified increases, more pumping power will be required. When the power limit of the pump laser 121 is reached and therefore the efficiency turns to zero, the control unit 140 turns the pump laser 120 on to provide more pumping power, sets the pump lasers 120 and 121 at the minimum power consumption setting, and adjusts the coupling factor of the tunable coupling device 130 adequately.

In a specific configuration of FIG. 2, the amplifiers including the gain mediums 110 and 111 are used in auto power control manner. The control by the control unit 140 is performed according to the amplifier setting parameters provided by the interface 150, according to the operating information of the pump lasers 120 and 121, and according to the power monitor information provided by the power monitors 148 and 149. The information provided by the power monitors 141 and 142 is not used.

Alternatively, the amplifiers including the gain mediums 110 and 111 are used in auto gain control manner. The control by the control unit 140 is performed according to the amplifier setting parameters provided by the interface 150, according to the operating information of the pump lasers 120 and 121, and according to the power monitor information provided by the power monitors 141, 142, 148, and 149. The information on the ratio of the power monitor 141 to the power monitor 148 provides the information on the gain by the gain medium 110. Identically, the information on the ratio of the power monitor 142 to the power monitor 149 provides the information on the gain by the gain medium 111.

Alternatively, the amplifiers including the gain mediums 110 and 111 are used in auto current control manner. The control by the control unit 140 is performed according to the amplifier setting parameters provided by the interface 150 and according to the operating information of the pump lasers 120 and 121. The information provided by the power monitors 141, 142, 148, and 149 is not used for the control. The target for the amplification is set using the sum of the driving currents of the pump lasers 120 and 121.

Alternatively, the target for the amplification is set using the sum of the driving currents of the pump lasers 120 and 121 taking into consideration the coupling factor C and its complementary (1-C).

In the case of controlling 2N amplifiers, where N is a positive integer, the configuration illustrated in FIG. 2 can be obviously used in a parallel manner. In this case, N amplification systems will be employed each of which is similar to one described in FIG. 2.

Figure 3:
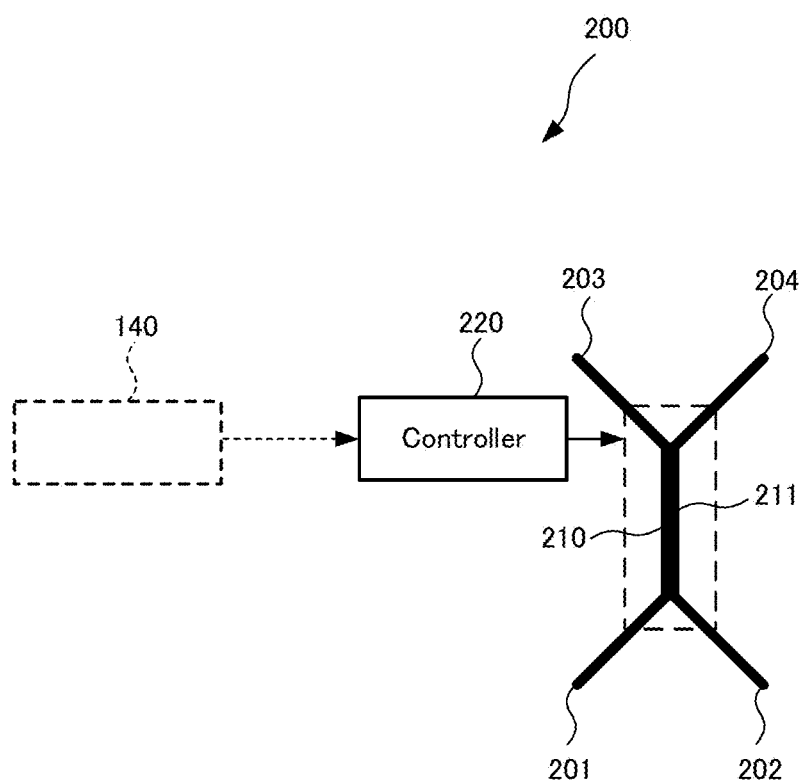
FIG. 3 is a block diagram illustrating the configuration of a first tunable coupling device in accordance with the second example embodiment of the present invention.

FIG. 3 is a block diagram illustrating the configuration of a tunable optical coupler 200, which can be used as the tunable coupling device 130 illustrated in FIG. 2. The tunable optical coupler 200 has two input fibers 201 and 202 and two output fibers 203 and 204. The tunable optical coupler 200 includes two coupling fibers 210 and 211 whose cores can perform evanescent coupling.

The coupling factor is tuned by a controller 220, which is actuated through an external signal. When the tunable optical coupler 200 is used as the tunable coupling device 130 illustrated in FIG. 2, the controller 220 is activated by the control unit 140 in FIG. 2. The controller 220 can be constituted by a step motor to displace the coupling fibers 210 and 211. Typically, such fibers have very low insertion loss in the order of 0.1 dB. The control of the coupling factor requires very low power consumption only when the coupling factor is changed.

Figure 4:
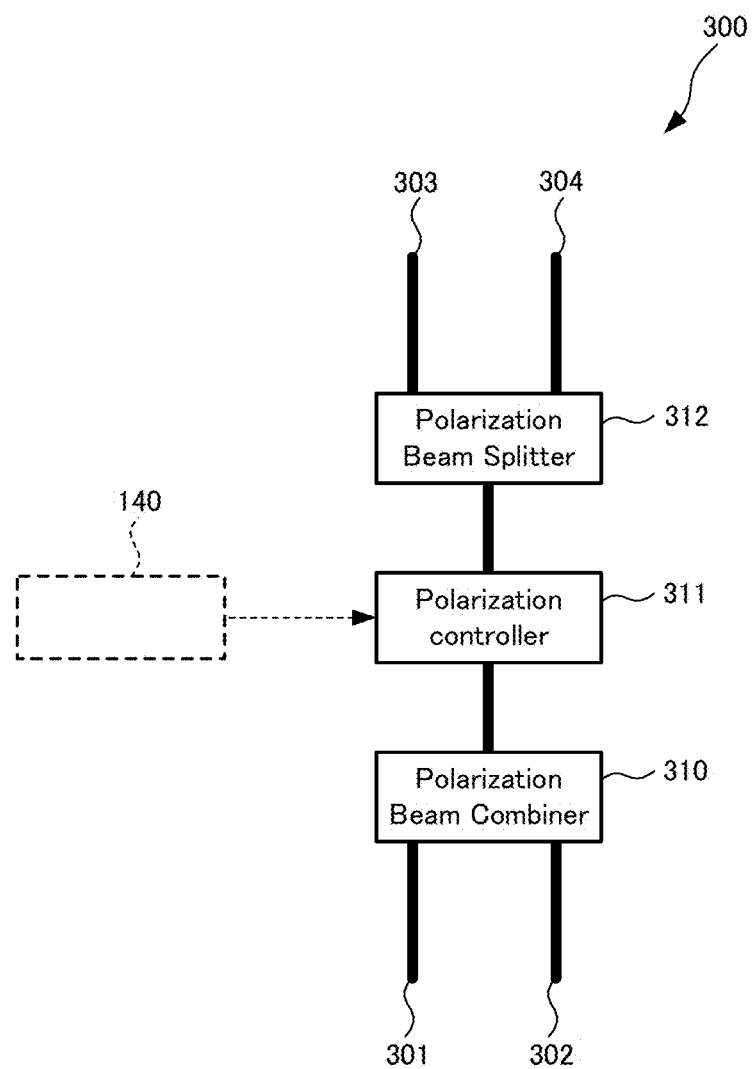
FIG. 4 is a block diagram illustrating the configuration of a second tunable coupling device in accordance with the second example embodiment of the present invention.

FIG. 4 is a block diagram illustrating the configuration of a tunable coupling apparatus 300, which can be used as the tunable coupling device 130 illustrated in FIG. 2. The tunable coupling apparatus 300 includes a polarization beam combiner 310, a polarization controller 311, and a polarization beam splitter 312. The tunable coupling apparatus 300 has two input fibers 301 and 302 that are the inputs of the polarization beam combiner 310. The tunable coupling apparatus 300 has two output fibers 303 and 304 that are the output fibers of the polarization beam splitter 312.

Two linear polarizations are combined orthogonally by the polarization beam combiner 310. When the tunable coupling apparatus 300 is used as the tunable coupling device 130 illustrated in FIG. 2, the input fibers 301 and 302 are polarization maintaining fibers, so that the linear polarization outputs of the pump lasers 120 and 121 are maintained and then combined. The coupling factor of the tunable coupling apparatus 300 is tuned by the polarization controller 311, which is actuated through an external signal. When the tunable coupling apparatus 300 is used as the tunable coupling device 130 illustrated in FIG. 2, the polarization controller 311 is activated by the control unit 140 in FIG. 2. The polarization controller 311 rotates the polarization of the light beam output by the polarization beam combiner 310 against the axes of the polarization beam splitter 312. As a result, the light beam resulting from combining the two input light beams is mapped on the two orthogonal polarization axes of the polarization beam splitter 312.

Figure 5:
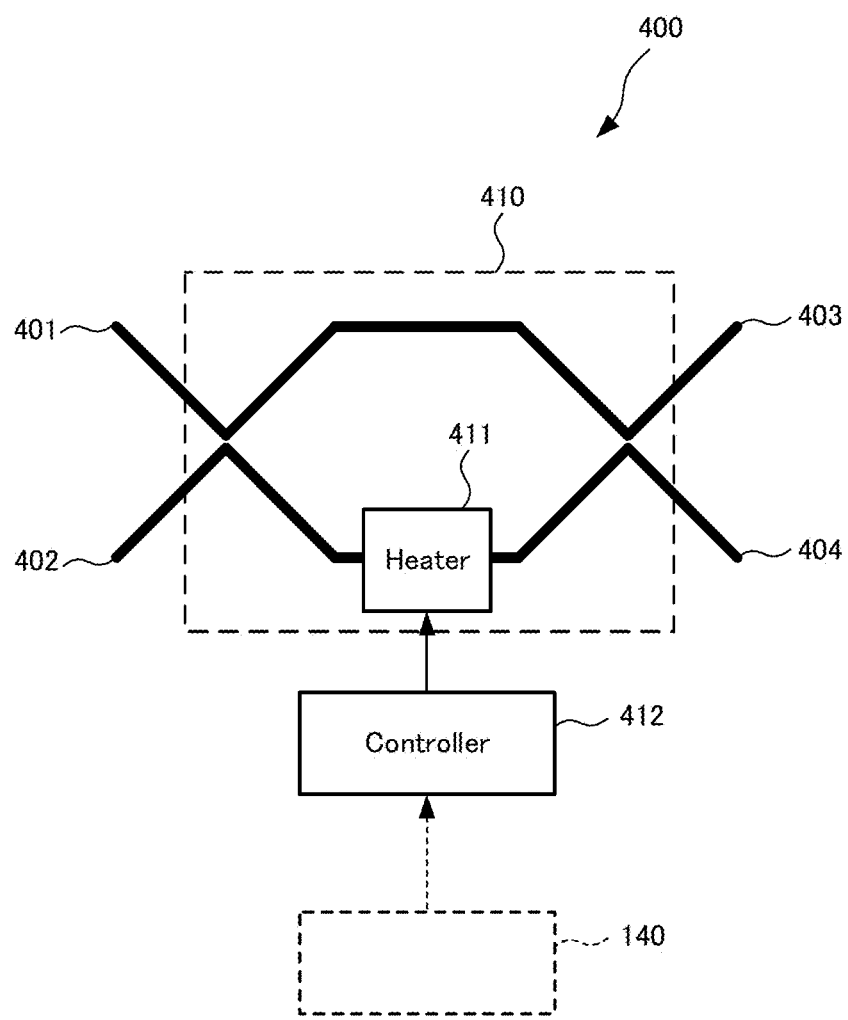
FIG. 5 is a block diagram illustrating the configuration of a third tunable coupling device in accordance with the second example embodiment of the present invention.

FIG. 5 is a block diagram illustrating the configuration of a Mach-Zehnder interferometer 400, which can be used as the tunable coupling device 130 illustrated in FIG. 2. The Mach-Zehnder interferometer 400 has two input fibers 401, 402, and two output fibers 403, 404 through which the constructive and destructive interference outputs propagate. The Mach-Zehnder interferometer 400 includes an interferometer structure 410 and a heater 411 that is placed on one arm of the interferometer structure 410. The interferometer structure 410 may be made of a fiber to reduce the insertion loss. The coupling factor is tuned by a controller 412. The controller 412 is actuated through an external signal, and it controls the heater 411 accordingly. Depending on the setting of the heater 411, the difference in phase appears between both arms of the interferometer structure 410.

When the Mach-Zehnder interferometer 400 is used as the tunable coupling device 130 illustrated in FIG. 2, the controller 412 is activated by the control unit 140 in FIG. 2. In this case, the pump lasers 120 and 121 are chosen so that their wavelengths may be different from each other. For easier control, the wavelengths can be set so that the wavelength interval may be greater than a half of the free spectral range of the interferometer. According to the phase difference tuned by the heater 411, the combination of the two input powers is output through the output fiber 403 as a constructive interference output, and its complementary part is output through the output fiber 404 as a destructive interference output.

Figure 6:
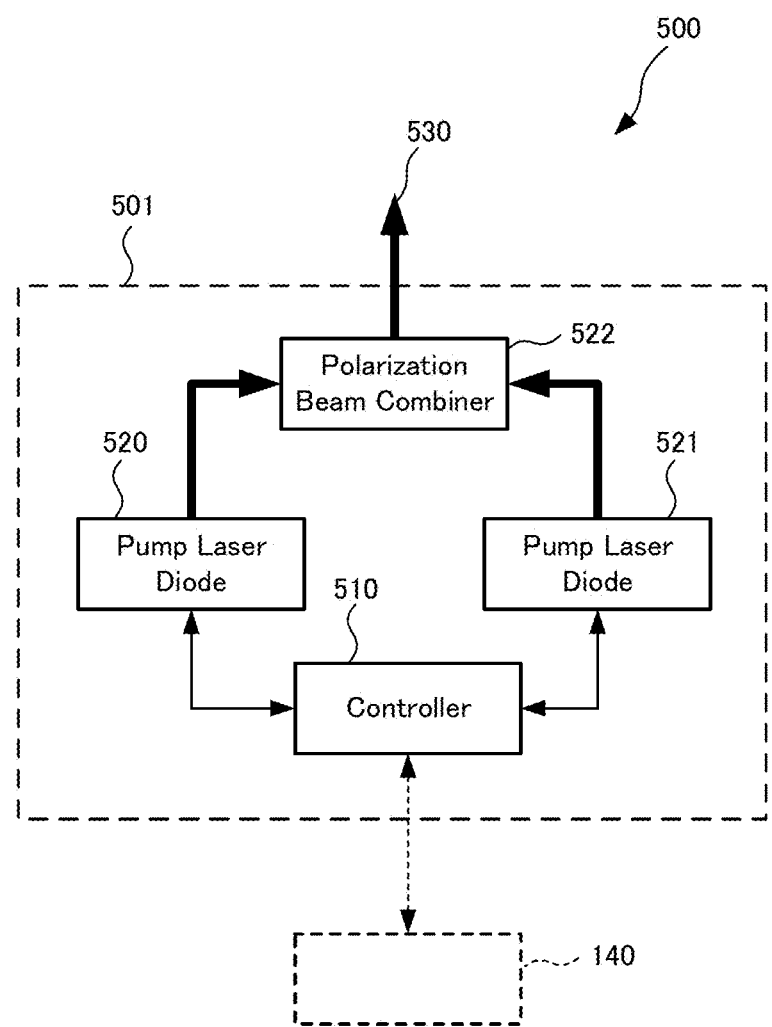
FIG. 6 is a block diagram illustrating the configuration of a laser apparatus in accordance with the second example embodiment of the present invention.

FIG. 6 is a block diagram illustrating the configuration of a laser apparatus 500 that can be used as any one of the pump lasers 120 and 121 illustrated in FIG. 2. The laser apparatus 500 includes two pump laser diodes 520 and 521. The output beams of the pump laser diodes 520 and 521 are combined by a polarization beam combiner 522 and output through a fiber 530. A controller 510 controls the output of both pump laser diodes 520 and 521 according to an external signal and returns monitor values of the pump laser diodes 520 and 521 to external control systems.

The pump laser diodes 520, 521, as well as the controller 510 and the polarization beam combiner 522 may be integrated in a package 501. When the laser apparatus 500 is used as the pump laser 120 illustrated in FIG. 2, the controller 510 drives both pump laser diodes 520 and 521 according to the control by the control unit 140 in FIG. 2. In this manner, the redundant pump laser diodes can be controlled as a single laser in the present example embodiment, which also increases the reliability of the optical amplifying apparatus 100 in FIG. 2.

Figure 7:
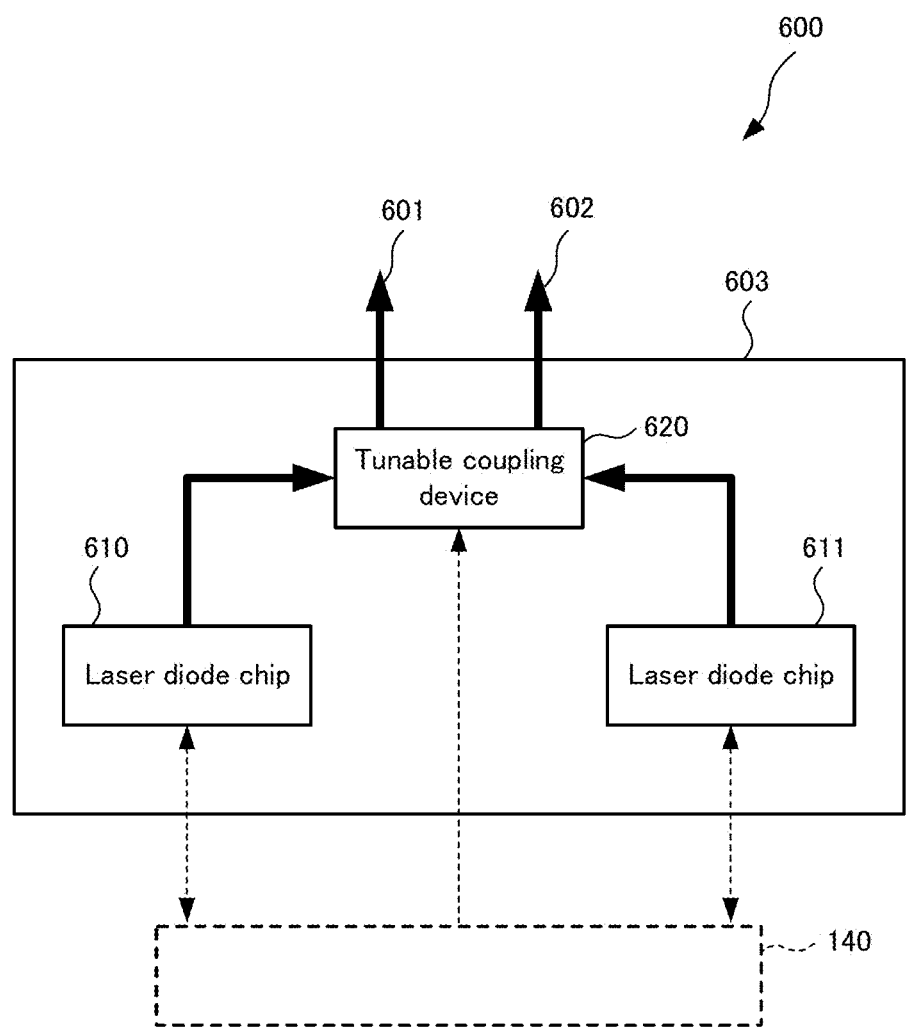
FIG. 7 is a block diagram illustrating the configuration of an excitation apparatus in accordance with the second example embodiment of the present invention.

FIG. 7 is a block diagram illustrating the configuration of an excitation apparatus 600 that can be used in place of the pump lasers 120 and 121 as well as the tunable coupling device 130 illustrated in FIG. 2. The excitation apparatus 600 includes two laser diode chips 610, 611 and a tunable coupling device 620. The excitation apparatus 600 is mounted inside a package 603. The excitation apparatus 600 has two outputs 601 and 602, which are the outputs of the tunable coupling device 620.

The driving of the laser diode chips 610 and 611 is performed by an external control system. The driving conditions of the laser diode chips 610 and 611 can be set by the external control system. The tunable coupling device can be also controlled from outside of the excitation apparatus 600. For instance, the tunable coupling device 620 can be realized with a tunable coupler, which can be integrated with the laser diode chips 610 and 611, and actuated by currents from the external control system.

When the excitation apparatus 600 is used in place of the pump lasers 120 and 121 as well as the tunable coupling device 130 in FIG. 2, the laser diode chips 610 and 611 as well as the tunable coupling device 620 are controlled in the same manner by the control unit 140. The driving conditions of the laser diode chips 610 and 611 are monitored by the control unit 140. The use of the excitation apparatus 600 enables lower cost through the integration in addition to the power reduction due to controlling the amplifiers.

As mentioned above, according to the optical amplifying apparatus 100 of the present example embodiment, it is possible to reduce the power consumption of a plurality of optical amplifiers even when there is a difference in the required pumping power between the plurality of optical amplifiers.

A Third Example Embodiment

Figure 8:
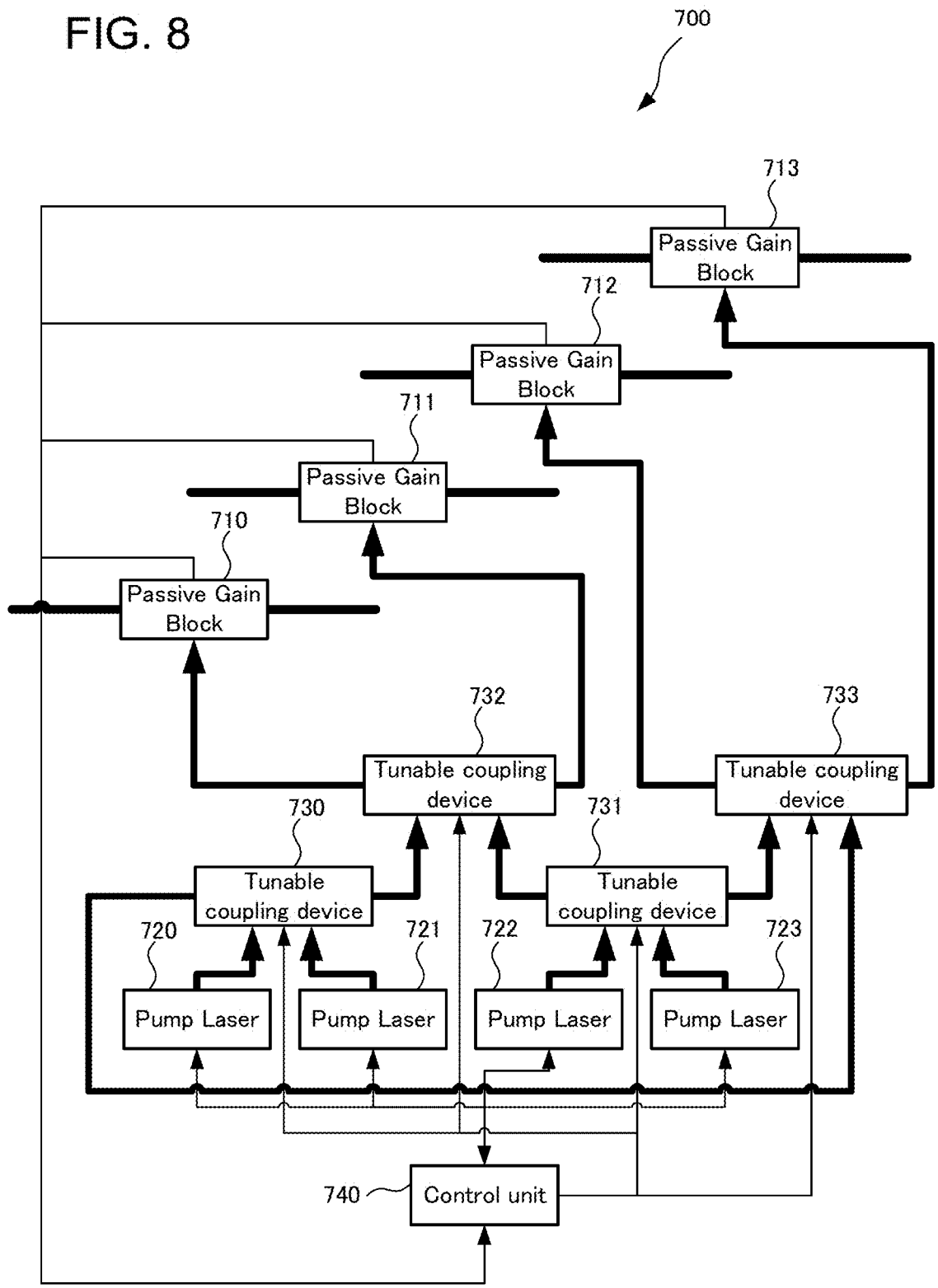
FIG. 8 is a block diagram illustrating the configuration of an optical amplifying apparatus in accordance with a third example embodiment of the present invention.

Next, a third example embodiment of the present invention will be described. FIG. 8 is a block diagram illustrating the configuration of an optical amplifying apparatus 700 in accordance with the third example embodiment of the present invention.

The optical amplifying apparatus 700 includes four passive gain blocks denoted by 710, 711, 712, and 713. Each of these passive gain blocks 710 to 713 is similar to an apparatus in which the gain medium 110 is integrated with the power monitors 141 and 148 illustrated in FIG. 2. Each of the passive gain blocks has a single mode fiber input and a single mode fiber output. The power monitors of each passive gain blocks are provided for a control unit 740.

The control unit 740 performs a control in a similar manner to the control unit 140; however, it is configured to operate with more passive gain blocks, pump lasers, and tunable coupling devices. The control unit 740 also contains the parameters for setting the amplifiers that use the passive gain blocks 710 to 713.

The optical pumps for the passive gain blocks 710 and 711 are provided by the tunable coupling device 732 through its two outputs. The optical pumps for the passive gain blocks 712 and 713 are provided by the tunable coupling device 733 through its two outputs. The two inputs of the tunable coupling device 732 are connected to one output of the tunable coupling device 730 and one output of the tunable coupling device 731. The two inputs of the tunable coupling device 733 are connected to one output of the tunable coupling device 730 and one output of the tunable coupling device 731. The two inputs of the tunable coupling device 730 are connected to the pump lasers 720 and 721. The two inputs of the tunable coupling device 731 are connected to the pump lasers 722 and 723.

The pump lasers 720 to 723 are identical to the pump lasers 120 and 121 illustrated in FIG. 2. The tunable coupling devices 730 to 733 are identical to the tunable coupling device 130 in FIG. 2.

The control unit 740 controls the pump lasers 720 to 723 as well as the coupling factors C of the tunable coupling devices 730 to 733. The control is performed according to the amplifier setting parameters internally provided for the control unit 740, according to the operating information of the pump lasers 720 to 723, and according to power monitor information provided by the passive gain blocks 710 to 713. The control according to the output powers is performed individually for the four passive gain blocks 710 to 713.

The control of the pump lasers 720 to 723 is performed individually depending on the monitored values and the amplifier setting parameters. At least one of the pump lasers may be turned off. In this case, the control unit 740 stores the updated operation values, and the control is performed according to the last stored values for the pump laser that is turned off.

The pumping light of the four pump lasers 720 to 723 can be distributed for each of the four passive gain blocks 710 to 713 through a 2×2-trellis structure of the tunable coupling devices. The same structure as that described on FIG. 8 can be adapted to 2N passive gain blocks, where N is a positive integer, with 2N laser and $N^2$ tunable coupling devices that are organized on N rows of N devices in a trellis manner.

Alternatively, up to three lasers from the pump lasers 720 to 723 may be removed from the structure illustrated in FIG. 8 for lower cost. In this case, this structure makes it possible to provide the pumping light correctly for the four passive gain blocks 710 to 713.

According to the control by the control unit 740, the pumping light of the pump lasers 720 to 723 is shared through the tunable coupling device. Each output of the pump lasers 720 to 723 is set to minimize the power consumption of the pump lasers.

According to the control by the control unit 740, the amplification of the passive gain blocks 710 to 713 does not require more pump power than necessary. The control is still valid when the input signals in the input optical fibers are reduced, or when the required output powers increase.

According to the optical amplifying apparatus 700 of the present example embodiment, the power consumption of four optical amplifiers including the passive gain blocks is reduced during the lifetime of the amplifiers. The reduction of power consumption is effective in the ageing of the system that causes the differences in the required optical pumping power, when the amplifiers are used for different bandwidths, or when the bandwidth changes over the lifetime of a network.

As mentioned above, according to the optical amplifying apparatus 700 of the present example embodiment, it is possible to reduce the power consumption of a plurality of optical amplifiers even when there is a difference in the required pumping power between the plurality of optical amplifiers.

A Fourth Example Embodiment

Figure 9:
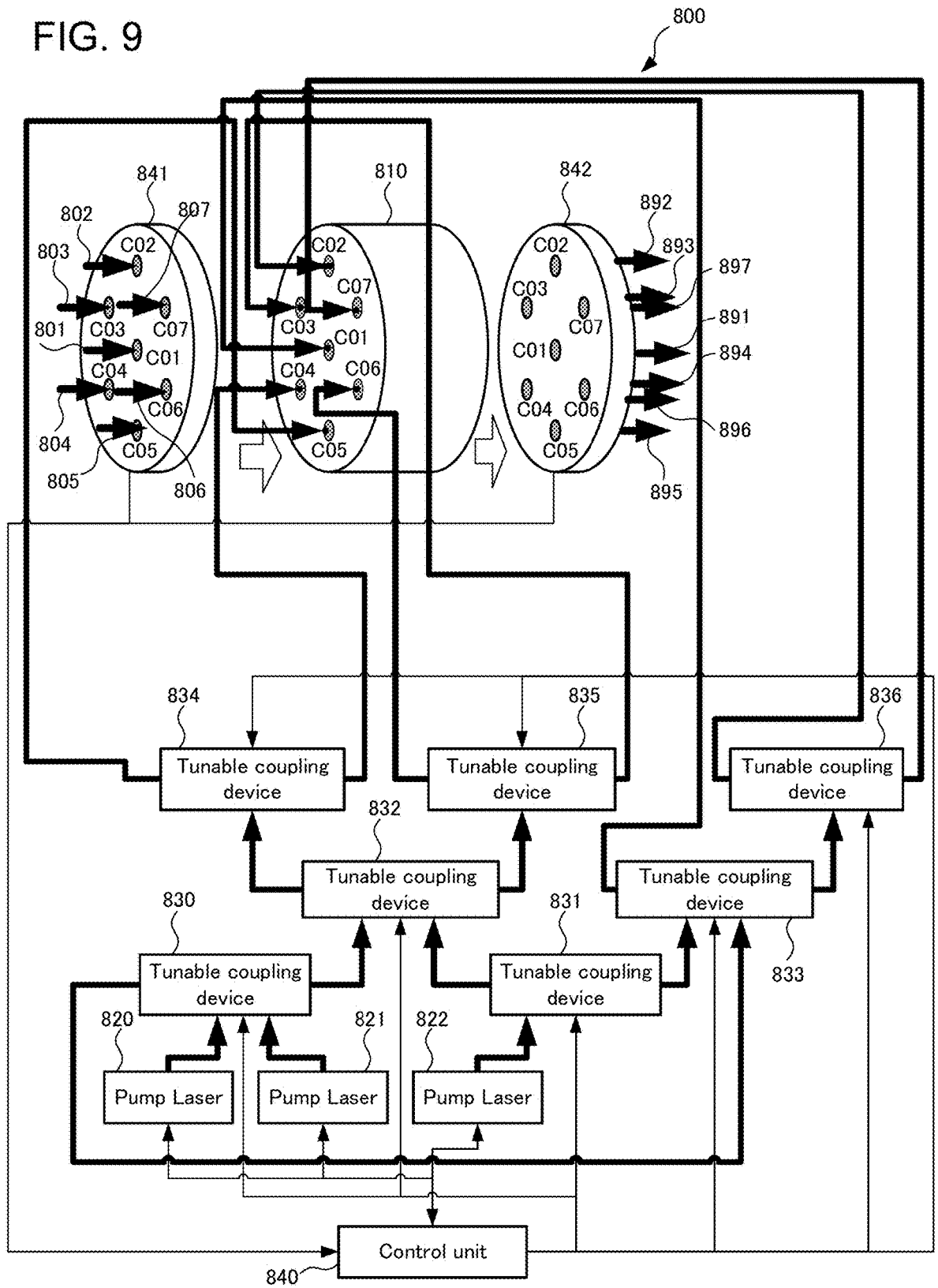
FIG. 9 is a block diagram illustrating the configuration of an optical amplifying apparatus in accordance with a fourth example embodiment of the present invention.

Next, a fourth example embodiment of the present invention will be described. FIG. 9 is a block diagram illustrating the configuration of an optical amplifying apparatus 800 in accordance with the fourth example embodiment of the present invention.

The optical amplifying apparatus 800 includes a multicore erbium doped fiber (MC-EDF) 810 having seven cores, which are denoted by C01 to C07. Each of the cores is an individual gain medium and is included in the same fiber 810. The input signals are denoted by 801 to 807 for the cores C01 to C07. The respective output signals are denoted by 891 to 897.

A power monitor 841 having seven cores monitors individually the power of the input signal into the MC-EDF 810. A monitor signal is generated individually for each input core by the power monitor 841. A power monitor 842 having seven cores monitors individually the power of the output signal from the MC-EDF 810. A monitor signal is generated individually for each output core by the power monitor 842. The information of the power monitors is provided for a control unit 840.

The control unit 840 performs a control in a similar manner to the control unit 740 illustrated in FIG. 8, but it is configured to operate with more gain blocks, pump lasers, and tunable coupling devices. The control unit 840 also contains the parameters for setting the amplifiers including the cores C01 to C07.

The MC-EDF 810 is pumped in individual core pumping manner. The optical pumps of cores C01 to C07 are provided by tunable coupling devices 833, 834, 835, and 836. Three other tunable coupling devices 830 to 832 are used in conjunction with the tunable coupling devices 833 to 836 in order to couple and distribute the pumping light generated by three pump lasers denoted by 820 to 822.

Each of the pump lasers is connected to the input of the tunable coupling device. Each of the tunable coupling devices 830, 832 and 833 has two input ports that are connected either to the pump lasers or to the outputs of other tunable coupling devices. Each of the tunable coupling devices 831, 834, 835, and 836 has one input port that is connected either to a pump laser or to the output of another tunable coupling device, whereas the other input port is left non-connected. Each of the output ports of the tunable coupling devices denoted by 830 to 836 is connected either to the core of the MC-EDF 810 or to the input port of another tunable coupling device.

Here, the number of the pump laser (3) is greater than one, but it is smaller than the number of individual gain mediums (7). The number of the tunable coupling devices (7) is greater than a half of the number of the gain mediums (3.5), but it is smaller than its square (49).

The control unit 840 controls the pump lasers denoted by 820 to 822 as well as the coupling factors C of the tunable coupling devices denoted by 830 to 836. The control is performed according to the amplifier setting parameters provided internally to the control unit 840, according to the operating information of the pump lasers 820 to 822, and according to power monitor information provided by the power monitors 841 and 842. The control according to the output powers is performed individually on the seven gain mediums C01 to C07 of the MC-EDF 810. The control of the pump lasers denoted by 820 to 822 is performed individually depending on the monitored values and the amplifier setting parameters. At least one of the pump lasers may be turned off. In this case, the control unit 840 stores the updated operation values, and the control is performed according to the last stored values for the pump laser that is turned off.

According to the control by the control unit 840, the pump light beams of the pump lasers denoted by 820 to 822 are shared through the tunable coupling device. The output of the pump lasers 820 to 822 is set for minimum power consumption of the pump lasers. According to the control by the control unit 840, the amplification of the cores C01 to C07 of the MC-EDF 810 does not require more pumping power than necessary. The control is still valid when the input signals in the input fibers are reduced, or when the required output powers increase.

According to the present example embodiment, the power consumption of the MCF optical amplifier is reduced during the lifetime of the amplifier. The reduction of power consumption is effective in the ageing of the system that causes the differences in the required optical pumping power, when the amplifier is used for different bandwidths, or when the bandwidth changes over the lifetime of a network.

As mentioned above, according to the optical amplifying apparatus 800 of the present example embodiment, it is possible to reduce the power consumption of a plurality of optical amplifiers even when there is a difference in the required pumping power between the plurality of optical amplifiers.

A Fifth Example Embodiment

Figure 10:
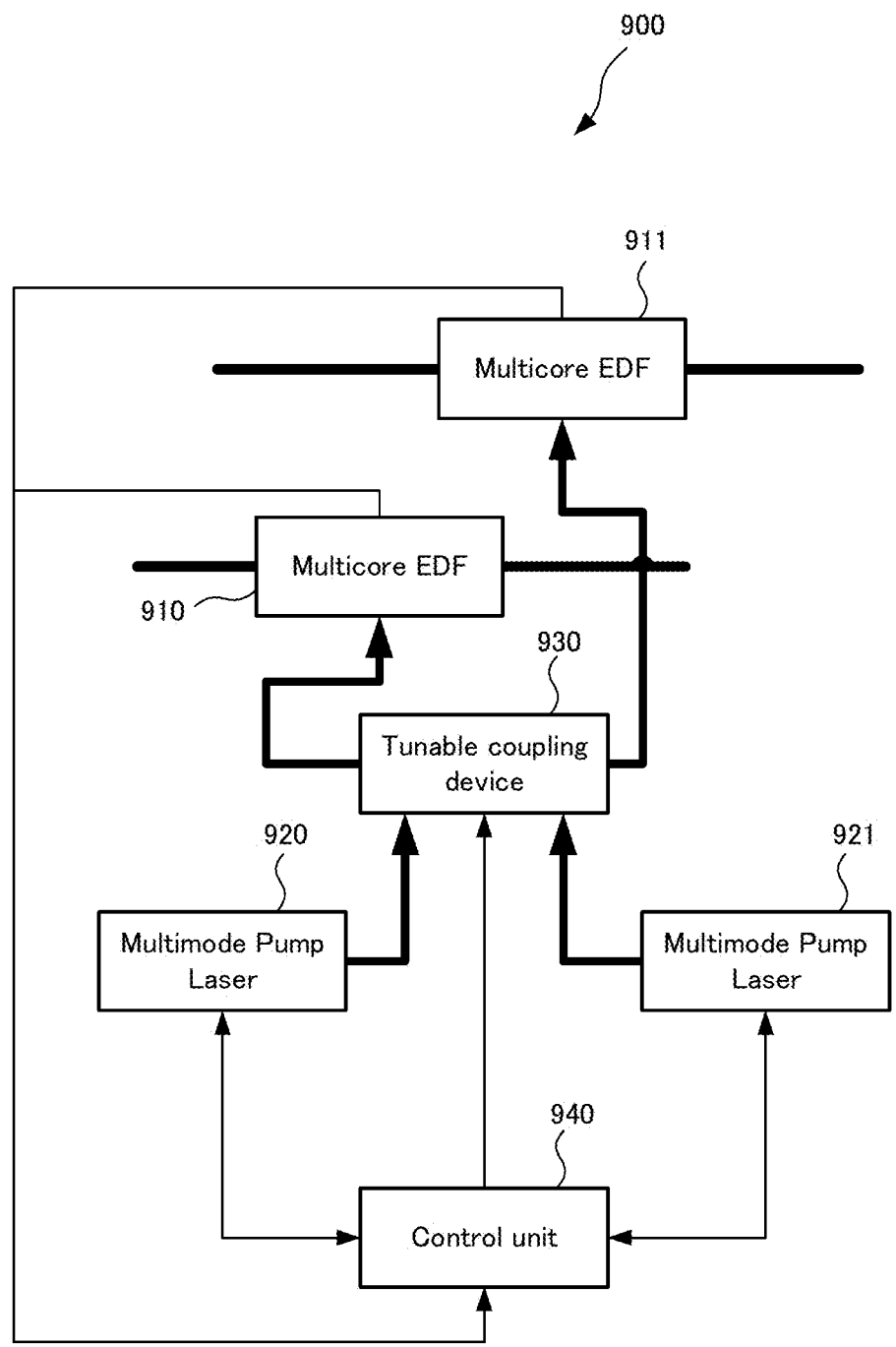
FIG. 10 is a block diagram illustrating the configuration of an optical amplifying apparatus in accordance with a fifth example embodiment of the present invention.

Next, a fifth example embodiment of the present invention will be described. FIG. 10 is a block diagram illustrating the configuration of an optical amplifying apparatus 900 in accordance with a fifth example embodiment of the present invention.

The optical amplifying apparatus 900 includes two multicore erbium doped fibers (MC-EDFs) denoted by 910 and 911. For instance, the MC-EDF may have 10 cores. The MC-EDF 910 and 911 include multiple core power monitors to monitor individually the power of the input signals and the output signals of them. The information on the power monitors is provided for a control unit 940. The control unit 940 performs a control in a similar manner to the control unit 840 in the fourth example embodiment.

The MC-EDFs 910 and 911 are pumped in common cladding pumping manner. The multimode optical pumps for cladding pumping are provided by a tunable coupling device 930. The tunable coupling device 930 has two input ports that are connected to multimode pump lasers 920 and 921.

The control unit 940 controls the multimode pump lasers 920 and 921 as well as the coupling factor C of the tunable coupling device 930. The control is performed according to the amplifier setting parameters provided internally for the control unit 940, according to the operating information on the multimode pump lasers 920 and 921, and according to power monitor information provided by the power monitors integrated in the MC-EDF 910 and 911. The control according to the output powers is performed on the MC-EDFs 910 and 911.

The control of the multimode pump lasers 920 and 921 is performed individually depending on the monitored values and the amplifier setting parameters; consequently, one of the multimode pump lasers may be turned off. In this case, the control unit 940 stores the updated operation values, and the control is performed according to the last stored values for the multimode pump laser that is turned off. According to the control by the control unit 940, the pump light beams of the multimode pump lasers 920 and 921 are shared through the tunable coupling device 930, and the output of the multimode pump lasers 920 and 921 are set for minimum power consumption of the multimode pump lasers.

According to the optical amplifying apparatus 900 of the present example embodiment, as is the case with the above-mentioned example embodiments, it is possible to reduce the power consumption of a plurality of optical amplifiers even when there is a difference in the required pumping power between the plurality of optical amplifiers.

A Sixth Example Embodiment

Next, a sixth example embodiment of the present invention will be described. In the present example embodiment, an example of the operation of the optical amplifying apparatus 100 in accordance with the second example embodiment in FIG. 2 is given with reference to a flowchart illustrated in FIG. 11.

Figure 11:
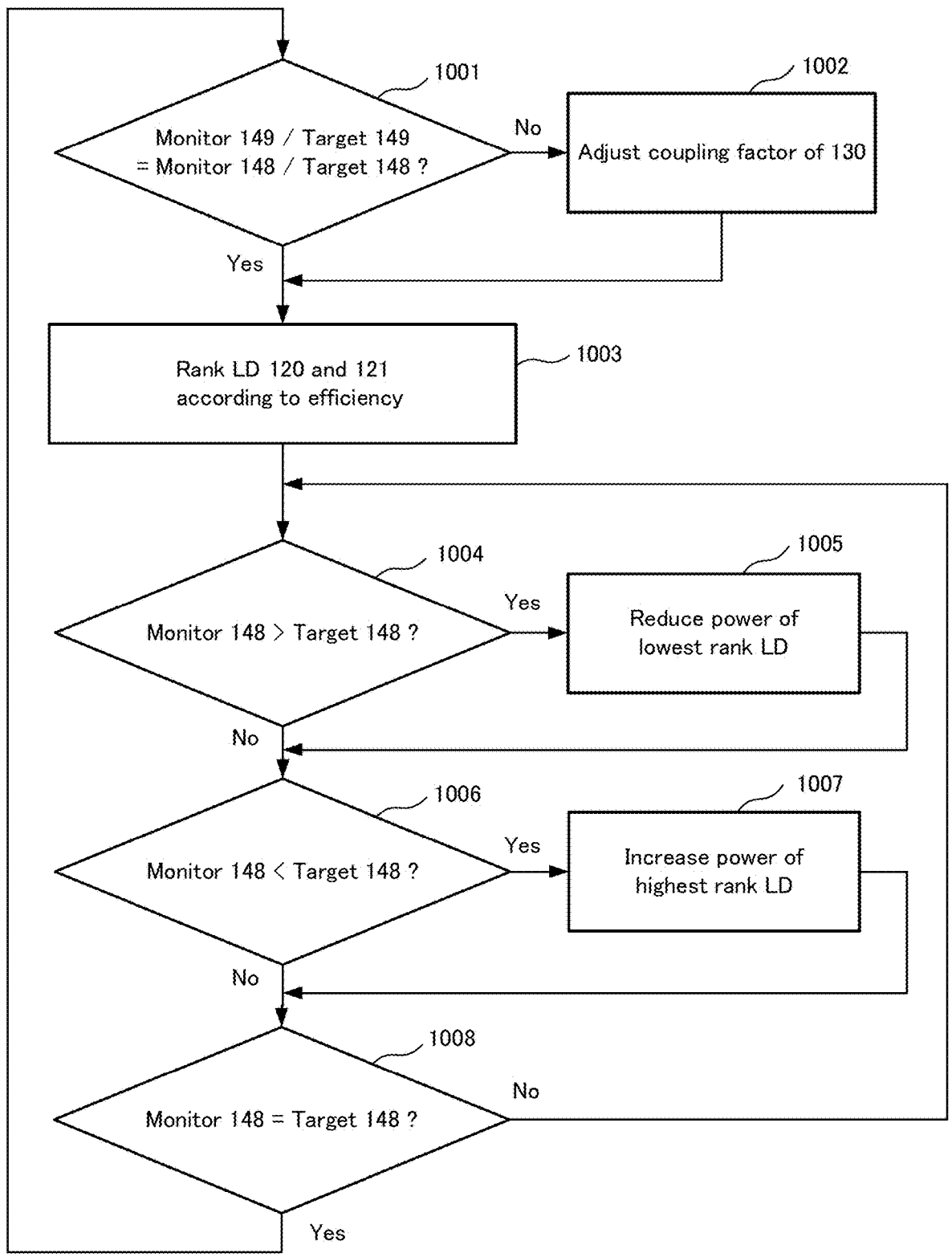
FIG. 11 is a flowchart to illustrate a control method of an optical amplifying apparatus in accordance with a sixth example embodiment of the present invention.

FIG. 11 is a flowchart to illustrate a method of amplifying an optical signal using the optical amplifying apparatus 100.

First, the control unit 140 uses the monitor information that is provided by the power monitors 148, 149 and compares them respectively with auto power control targets provided by the interface 150. The control unit 140 calculates the ratio of the monitored power to the target power for both power monitors (step 1001).

If the two calculated ratios are equal (step 1001/Yes), the control unit 140 directly goes to step 1003. If the calculated ratios are not equal (step 1001/No), the control unit 140 controls the coupling factor C of the tunable coupling device 130 in order to make the ratios equal (step 1002). At this point, further checking the equality of the ratios is not required, and the control unit 140 can go directly to the step 1003. If one of the power control targets is null, the values for the coupling factor are only allowed to be C=0 and C=1 after the control, based on the power monitor that has a non-null target.

The control unit 140 ranks the pump lasers 120 and 121 according to their power consumption efficiency (step 1003). The efficiency may be calculated as the ratio of the monitored output power that is provided for the control unit 140 by monitor photodiodes integrated in the pump lasers 120 and 121 to the driving operation current provided for the pump lasers 120 and 121. Alternatively, for pump lasers, the ratio may be calculated by dividing the monitored output power by the sum of the operation current and the pump current, or by the sum of their square values.

For pump lasers that have been turned off, the efficiency is calculated using stored value of the latest operation values of the pump lasers. As a result, one of the pump lasers 120 and 121 has the highest rank, and the other one has the lower rank.

Then the monitored power information provided by the power monitor 148 is compared to its target value provided by the interface 150 (step 1004). If the monitored value is greater than the target value (step 1004/Yes), the power output by the pump laser with lowest efficiency is reduced (step 1005). If the pump laser with lowest rank reaches an operation current of zero, it is turned off, and its last efficiency value is stored by the control unit 140. If the pump laser with lowest rank has been already turned off, the laser with the next higher rank is controlled instead, to reduce its output power.

Then the monitored power information provided by the power monitor 148 is compared to its target value provided by the interface 150 again (step 1006). If the monitored value is smaller than the target value (step 1006/Yes), the power output by the pump laser with highest efficiency is increased (step 1007). If the pump laser with highest rank reaches to its above limit of the operation current, the laser with the next highest rank is controlled instead to increase its output power.

Then the monitored power information provided by the power monitor 148 is compared to its target value provided by the interface 150 again (step 1008). If the values are equal (step 1008/Yes), the control loop goes back to the step 1001. If the values are not equal or outside the tolerance range (step 1008/No), the control loop goes back to step 1004.

In this manner, the control unit 140 in FIG. 2 is able to control three parameters, that is, the coupling factor C of the tunable coupling device 130, the output of the pump laser 120 and the output of the pump laser 121 according to two power monitors 148 and 149. This makes it possible to achieve and maintain reduced power consumption despite the fact that only the target values and actual values of the outputs of the power monitors 148 and 149 are used.

In the above description, the step for reducing the output power of the pump laser (step 1005) and the step for increasing the output power of the pump laser (step 1007) are performed after the step for calculating the ratio of the monitored power to the target power (step 1001) and the step for controlling the coupling factor C in order to make the ratios equal (step 1002). However, the step for reducing the output power (step 1005) and the step for increasing the output power (step 1007) may be performed before the step for calculating the ratio (step 1001) and the step for controlling the coupling factor C (step 1002).

The same control method can be applied to the control unit 740 according to the third example embodiment illustrated in FIG. 8. In this case, step 1001 and step 1002 are repeated for each tunable coupling devices 730 to 733. For each tunable coupling device, the ratio between target value and monitor value is compared to a different pair of gain mediums to which the output of the controlled tunable coupling device is connected.

Because there are $N^2$ tunable coupling devices at maximum for N gain mediums, there are sufficient pairs of the tunable coupling devices for possible comparison. In the same case, all pump lasers 120 to 123 are ranked at step 1003; consequently, four ranks are created. The control of the highest rank and lowest rank LDs can be performed with the same monitor information.

An additional step for increasing the optical power output by the laser with highest-rank efficiency and reducing the optical power output by the laser with lowest-rank efficiency in the same proportion can be added between step 1008 and step 1001. The effect of this additional step is to accelerate effectively the reduction in the power consumption of the optical amplifying apparatus.

Figure 12:
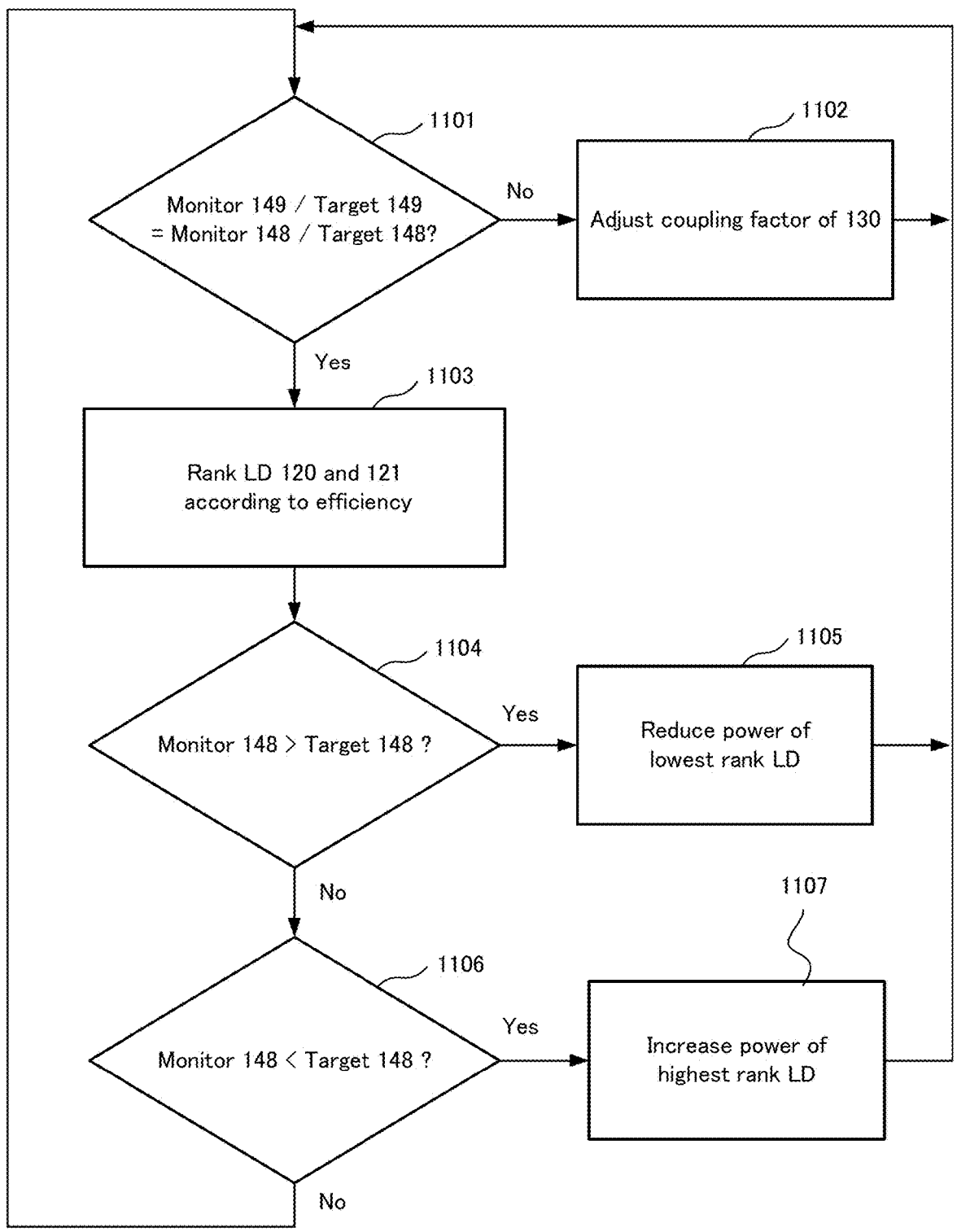
FIG. 12 is a flowchart to illustrate a control method of an optical amplifying apparatus in accordance with a sixth example embodiment of the present invention.

Next, another example of the operation of the optical amplifying apparatus 100 in accordance with the second example embodiment in FIG. 2 is given with reference to a flowchart illustrated in FIG. 12.

FIG. 12 is a flowchart to illustrate a method of amplifying an optical signal using the optical amplifying apparatus 100.

First, step 1101 is identical to step 1001 of FIG. 11. If the two calculated ratios are equal (step 1101/Yes), the control unit 140 directly goes to step 1103. If the calculated ratios are not equal (step 1101/No), the control unit 140 controls the coupling factor C of the tunable coupling device 130 in order to make the ratios equal (step 1102). Step 1101 and step 1102 are repeated until the ratios calculated at step 1101 becomes equal.

Steps 1103, 1104, 1105, 1106, and 1107 are identical to respective steps 1003, 1004, 1005, 1006, and 1007 of FIG. 11. However, after step 1105 and step 1107, the control loop jumps to step 1101. After step 1106, the control loop jumps to step 1101.

In this manner, the control unit 140 in FIG. 2 is able to control three parameters, that is, the coupling factor C of the tunable coupling device 130, the output of the pump laser 120 and the output of the pump laser 121 according to two power monitors 148 and 149. This makes it possible to achieve and maintain reduced power consumption despite the fact that only the target values and actual values of the outputs of the power monitors 148 and 149.

Identically to the control method illustrated in FIG. 11, the control method illustrated in FIG. 12 can be applied to the control units 740, 840, and 940 illustrated in FIG. 8, FIG. 9, and FIG. 10, respectively.

An additional step for increasing the optical power output by the laser with highest-rank efficiency and reducing the optical power output by the laser with lowest-rank efficiency in the same proportion can be added between step 1106 and step 1101. The effect of this additional step is to accelerate effectively the reduction in the power consumption of the optical amplifying apparatus.

Figure 13A:
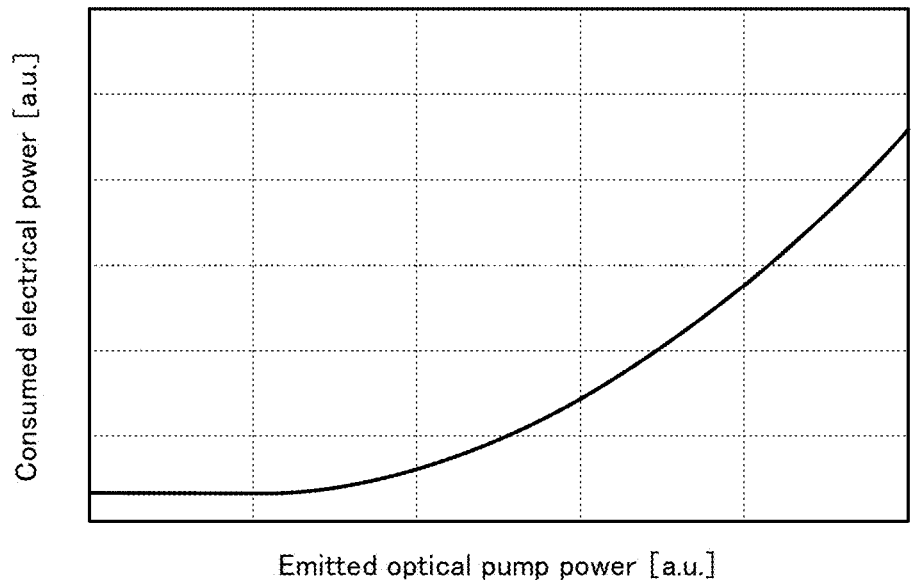
FIG. 13A is a diagram illustrating the simulation results of power consumption of a pump laser in accordance with the second example embodiment of the present invention.

FIG. 13A is a diagram illustrating the simulation result of the power consumption of the pump laser 120 in FIG. 2 that is plotted against the output optical pump power. It is clear that there is a threshold effect. This implies that some amount of energy has to be consumed before high power required for optical pumping of a gain medium can be achieved. Therefore, sharing the same laser diode among several gain mediums leads to power reduction in optical amplification.

Figure 13B:
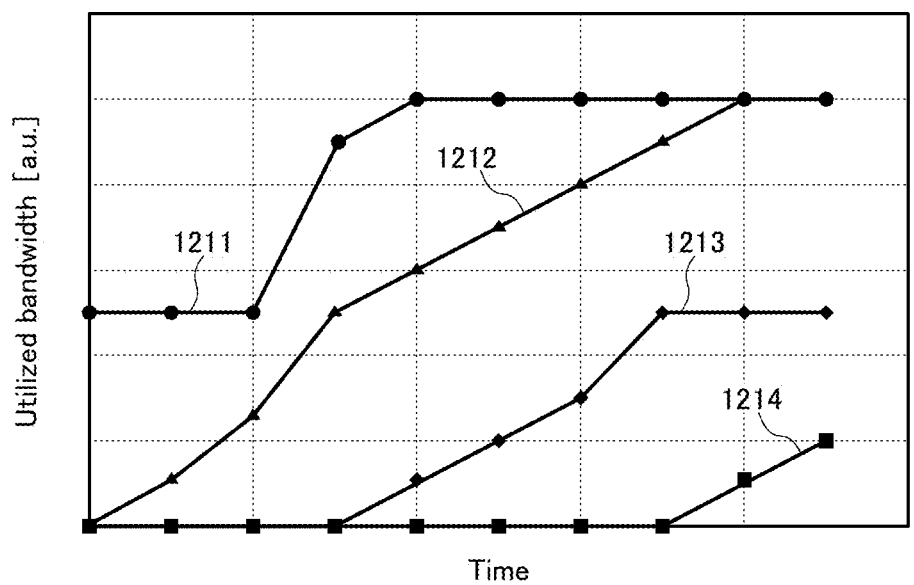
FIG. 13B is a diagram illustrating the simulation results of the wavelengths used by the optical amplifying apparatus according to the third example embodiment.

FIG. 13B is a diagram illustrating the simulation results of the traffic evolution in the network. In this simulation, the optical amplifying apparatus 700 according to the third example embodiment illustrated in FIG. 8 is used.

Each of the curves 1211, 1212, 1213, and 1214 represents the traffic that passes through each of the passive gain blocks 710, 711, 712, and 713 during the lifetime of the network. At first, the traffic is moderate; consequently, only a portion of the WDM wavelengths available passes through the passive gain block 710. As time passes, the traffic increases, and more wavelengths are being used. That is to say, the wavelengths amplified through the passive gain blocks 711, 712, and 713 in addition to the passive gain block 710 are gradually used.

Figure 13C:
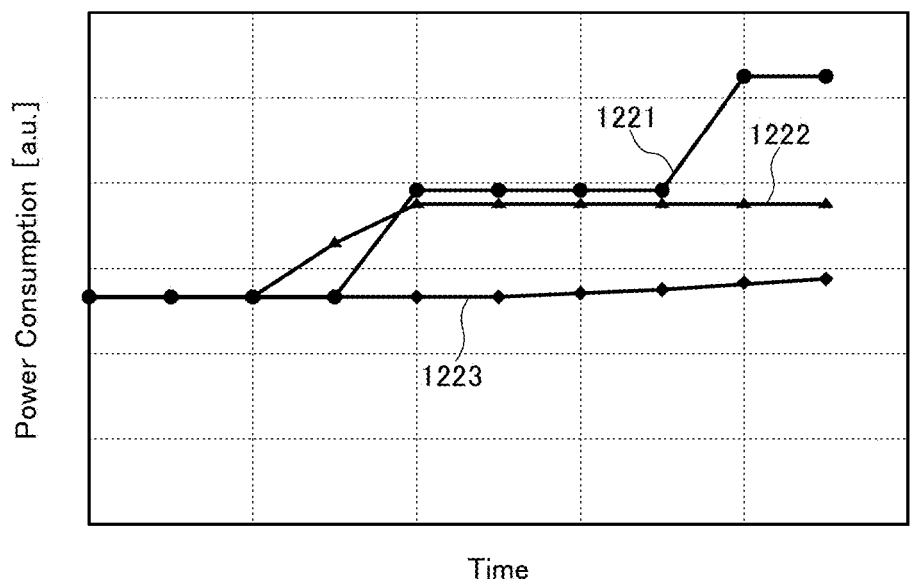
FIG. 13C is a diagram illustrating the simulation results of the power consumption of the optical amplifying apparatus according to the third example embodiment.

FIG. 13C is a diagram illustrating the simulation results of the power consumption of the optical amplifying apparatus 700 according to the third example embodiment illustrated in FIG. 8. The simulation is performed under the traffic conditions illustrated in FIG. 13B.

The curve 1223 shows the simulation results for the optical amplifying apparatus in FIG. 8 that is controlled according to the control method similar to that described in FIG. 11. For comparison, the curve 1221 is plotted on the same graph, and it represents the power consumption under the same conditions of the conventional amplification in which each passive gain block has its own dedicated pump laser. For comparison also, the curve 1222 represents the power consumption under the same conditions of an optical amplifier using optical couplers with fixed ratio.

Because the curve 1223 is always lower than the curves 1221 and 1222, the optical amplifying apparatus according to the example embodiments makes it possible to reduce efficiently the power consumption of the optical amplification over the lifetime of the network, even when the traffic changes between fibers through which optical signals are amplified.

A Seventh Example Embodiment

Figure 14:
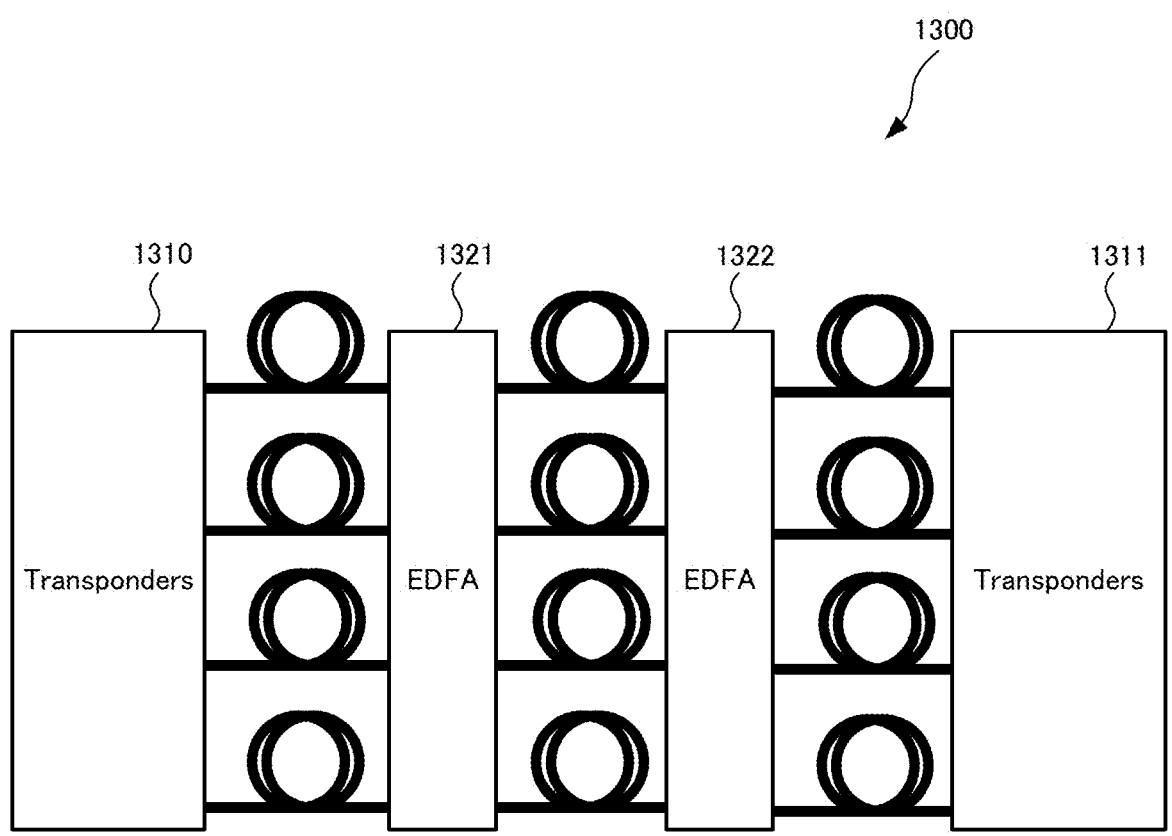
FIG. 14 is a block diagram illustrating the configuration of a network system using optical amplifying apparatuses in accordance with a seventh example embodiment of the present invention.

Next, a seventh example embodiment of the present invention will be described. FIG. 14 is a block diagram illustrating the configuration of a network system 1300 using optical amplifying apparatuses in accordance with the seventh example embodiment of the present invention.

The network system 1300 includes a node apparatus in which transponders are aggregated. The transponders in the node apparatus 1310 multiplex optical signals in wavelength and also multiplex them spatially through four fiber lines, and links to another node apparatus 1311 in which transponders are aggregated. Between the node apparatus 1310 and the node apparatus 1311, two groups of erbium doped fiber amplifiers (EDFAs) 1321 and 1322 are placed between spans of optical fibers.

Each of the EDFAs 1321 and 1322 may be similar to the optical amplifying apparatus 700 illustrated in FIG. 8. Alternatively, each of the EDFAs 1321 and 1322 may be similar to two sets of the optical amplifying apparatus 100 illustrated in FIG. 2 used in parallel. Alternatively, the optical fibers between the node apparatus 1310 and the node apparatus 1311 are multicore fibers, and the EDFAs 1321 and 1322 are similar to four sets of the optical amplifying apparatus 800 illustrated in FIG. 9 used in parallel. Alternatively, the optical fibers between the node apparatus 1310 and the node apparatus 1311 are multicore fibers, and the EDFAs 1321 and 1322 are similar to two sets of the optical amplifying apparatus 900 illustrated in FIG. 10 used in parallel.

Depending on variation in traffic carried by the transponders that are aggregated in the node apparatuses 1310 and 1311, the setting of the EDFAs 1321, 1322, their pump lasers, and tunable coupling devices is changed. The setting may be changed according to the control method described in FIG. 11. Alternatively, the setting may be changed according to the control method described in FIG. 12. The power consumption of the optical amplification in the network system is reduced accordingly.

In addition, some of the optical fibers between the EDFA 1321 and the EDFA 1322 can be repaired and spliced, which causes an additional span loss. In this case, the setting of the EDFA may be changed again according to the control method described in FIG. 11 or FIG. 12. The power consumption of the optical amplification in the network system is reduced accordingly.

Figure 15:
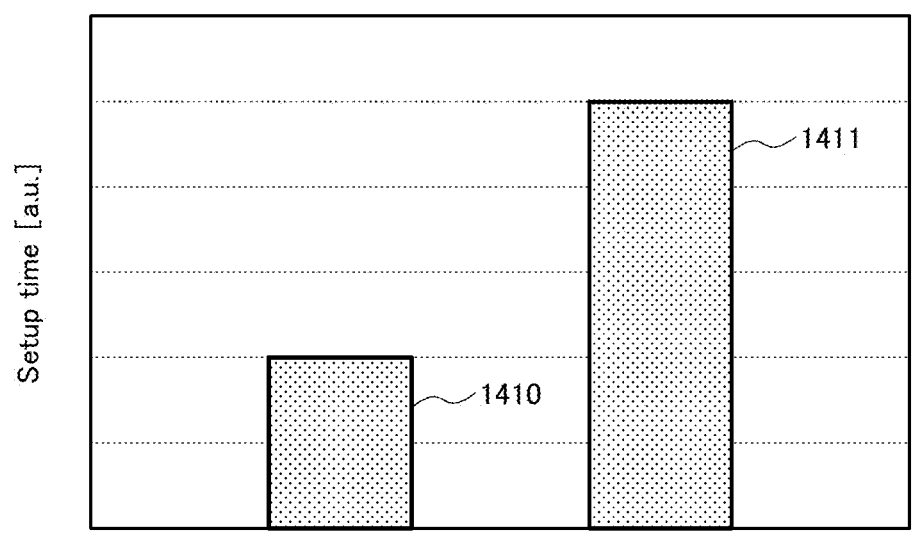
FIG. 15 is a diagram illustrating the simulation results of the time required to setup the network system in accordance with the seventh example embodiment of the present invention.

FIG. 15 is a diagram illustrating the simulation results of the time required to setup the network system 1300 in FIG. 14. In this simulation, each of the EDFA 1321 and the EDFA 1322 is similar to the optical amplifying apparatus 700 in the third example embodiment illustrated in FIG. 8. The setup time means the elapsed time from the introduction of the wavelength information of the transponders in the node apparatuses 1310 and 1311 to the stabilization of the EDFAs 1321 and 1322.

The bar 1410 represents the time required when the EDFAs 1321 and 1322 are controlled by the procedure described in FIG. 11. For reference, the bar 1411 represents the time required for the same conditions of the network system, but the setup values of the EDFAs 1321 and 1322 are determined by scanning the values for the tunable coupling devices and laser diodes in FIG. 8 over the possible values before starting the operation. It can be seen that the present example embodiment enables the amplifiers in the network system to be set more quickly.

As mentioned above, according to the network system 1300 using optical amplifying apparatuses in accordance with the seventh example embodiment, it is possible to reduce the setting time of the network where several optical amplifiers are used. That is to say, it is possible to reduce the time between the installation of the network and the actual transmission of optical signals.

The whole or part of the example embodiments disclosed above can be described as, but not limited to, the following supplementary notes.

(Supplementary note 1) An optical amplifying apparatus, comprising: a plurality of optical amplifying means for amplifying a plurality of optical signals, each of the plurality of optical amplifying means including a gain medium; a plurality of laser light generating means for generating a plurality of laser beams; at least one optical coupling means for coupling the plurality of laser beams variably in accordance with a coupling factor and outputting a plurality of excitation light beams, each of the plurality of excitation light beams exciting the gain medium; and controlling means for controlling the coupling factor and an output power of each of the plurality of laser light generating means.

(Supplementary note 2) The optical amplifying apparatus according to Supplementary note 1, wherein the at least one optical coupling means includes a plurality of optical coupling means, and the controlling means controls the coupling factor of each of the plurality of optical coupling means.

(Supplementary note 3) The optical amplifying apparatus according to Supplementary note 1 or 2, wherein the gain medium is a core included in a multicore fiber, and each of the plurality of laser light generating means directly excites the gain medium by each of the plurality of excitation light beams.

(Supplementary note 4) The optical amplifying apparatus according to Supplementary note 1 or 2, wherein the gain medium is a multicore fiber, each of the plurality of laser light generating means excites the gain medium by pumping a clad of the multicore fiber, and each of the plurality of excitation light beams is a multimode light beam.

(Supplementary note 5) The optical amplifying apparatus according to any one of Supplementary notes 1, 2, 3, and 4, wherein number of the plurality of optical amplifying means represented by positive integer N, number of the at least one optical coupling means represented by positive integer M, and number of the plurality of laser light generating means represented by positive integer L satisfy relational expressions of $N \geq 2$, $(N/2) \leq M \leq (N^2/4)$, and $L \leq 2 \times M$.

(Supplementary note 6) The optical amplifying apparatus according to Supplementary note 5, wherein a relational expression of $L=N=M^2/4$ is satisfied.

(Supplementary note 7) The optical amplifying apparatus according to Supplementary note 5, wherein a relational expression of $L=N=M/2$ is satisfied.

(Supplementary note 8) The optical amplifying apparatus according to any one of Supplementary notes 1, 2, 3, 4, 5, 6, and 7, wherein the at least one optical coupling means is a tunable optical coupler, the tunable optical coupler includes two input fibers, two output fibers, and two coupling fibers whose cores are configured to perform evanescent coupling, and the controlling means controls the coupling factor by displacing the two coupling fibers.

(Supplementary note 9) The optical amplifying apparatus according to any one of Supplementary notes 1, 2, 3, 4, 5, 6, and 7, wherein the at least one optical coupling means includes a polarization beam combiner configured to combine orthogonally the plurality of laser beams with linear polarization, a polarization controller configured to rotate a polarization of a light beam output by the polarization beam combiner, and a polarization beam splitter configured to split a light beam output by the polarization controller, the controlling means controls the coupling factor by controlling the polarization controller.

(Supplementary note 10) The optical amplifying apparatus according to any one of Supplementary notes 1, 2, 3, 4, 5, 6, and 7, wherein the at least one optical coupling means includes a Mach-Zehnder interferometer, the Mach-Zehnder interferometer includes an interferometer structure, and a heater that is placed on one arm of the interferometer structure and tunes a difference in phase between both arms of the interferometer structure, and the controlling means controls the coupling factor by controlling the heater.

(Supplementary note 11) The optical amplifying apparatus according to any one of Supplementary notes 1, 2, 3, 4, 5, 6, 7, 8, 9, and 10, wherein each of the plurality of laser light generating means is an identical type of laser light source.

(Supplementary note 12) The optical amplifying apparatus according to any one of Supplementary notes 1, 2, 3, 4, 5, 6, 7, 8, 9, and 10, wherein the plurality of laser light generating means are more than one type of laser light sources and have different specifications.

(Supplementary note 13) A method of amplifying an optical signal, comprising: generating a plurality of laser beams; coupling the plurality of laser beams variably in accordance with a coupling factor and generating a plurality of excitation light beams; exciting, by the plurality of excitation light beams, a plurality of gain mediums through which a plurality of optical signals passing; and controlling the coupling factor and an output power of each of the plurality of laser beams.

(Supplementary note 14) The method of amplifying the optical signal according to Supplementary note 13, wherein the controlling of the coupling factor and the output power includes monitoring an output level of optical signal having passed through each of the plurality of gain mediums, calculating a ratio of the output level to a target value; and controlling the coupling factor so as to make the ratio for one of the plurality of gain mediums equal to the ratio for another of the plurality of gain mediums.

(Supplementary note 15) The method of amplifying the optical signal according to Supplementary note 14, wherein the controlling of the coupling factor and the output power includes evaluating efficiency for generating each of the plurality of laser beams, decreasing optical power of laser beam with the efficiency lowest among the plurality of laser beams when the output level being greater than the target value, and increasing optical power of laser beam with the efficiency highest among the plurality of laser beams when the output level being smaller than the target value.

(Supplementary note 16) The method of amplifying the optical signal according to Supplementary note 15, wherein the decreasing of the optical power and the increasing of the optical power are performed after the calculating of the ratio and the controlling of the coupling factor.

(Supplementary note 17) The method of amplifying the optical signal according to Supplementary note 15, wherein the decreasing of the optical power and the increasing of the optical power are performed before the calculating of the ratio and the controlling of the coupling factor.

(Supplementary note 18) The method of amplifying the optical signal according to any one of Supplementary notes 13, 14, 15, 16, and 17, wherein the plurality of gain mediums are controlled in an auto power control manner, in accordance with output signal power output from each of the plurality of gain mediums.

(Supplementary note 19) The method of amplifying the optical signal according to any one of Supplementary notes 13, 14, 15, 16, and 17, wherein the plurality of gain mediums are controlled in auto gain control manner, in accordance with input signal power inputted into each of the plurality of gain mediums and output signal power output from each of the plurality of gain mediums.

(Supplementary note 20) The method of amplifying the optical signal according to any one of Supplementary notes 13, 14, 15, 16, and 17, wherein the plurality of gain mediums are controlled in auto current control manner, in accordance with currents to generate the plurality of laser beams.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

REFERENCE SIGNS LIST

10, 100, 700, 800, 900 optical amplifying apparatus
20 optical amplifier
30 laser light source
40 optical coupling device 50 controller
101, 102, 108, 109 optical fiber
110, 111 gain medium
120, 121, 720 to 723, 820 to 822 pump laser
130, 620, 730 to 733, 830 to 836, 930 tunable coupling device
131, 132, 133, 134, 530 fiber
140, 740, 840, 940 control unit
141, 142, 148, 149, 841, 842 power monitor
150 interface
200 tunable optical coupler
201, 202, 301, 302, 401, 402 input fiber
203, 204, 303, 304, 403, 404 output fiber
210, 211 coupling fiber
220, 412 controller
300 tunable coupling apparatus
310 polarization beam combiner
311 polarization controller
312 polarization beam splitter
400 Mach-Zehnder interferometer
410 interferometer structure
411 heater
500 laser apparatus
501 package
510 controller
520, 521 pump laser diode
522 polarization beam combiner
600 excitation apparatus
601, 602 output
603 package
610, 611 laser diode chip
710, 711, 712, 713 passive gain block
801 to 807 input signal
810, 910, 911 multicore erbium doped fiber
891 to 897 output signal
920, 921 multimode pump laser
1300 network system
1310, 1311 node apparatus
1321, 1322 erbium doped fiber amplifier

The invention claimed is:

1. An optical amplifying apparatus, comprising:
a plurality of optical amplifiers configured to amplify a plurality of optical signals, each of the plurality of optical amplifiers including a gain medium;
a plurality of laser light sources configured to generate a plurality of laser beams;
at least one optical coupling device configured to couple the plurality of laser beams variably in accordance with a coupling factor and output a plurality of excitation light beams, each of the plurality of excitation light beams exciting the gain medium; and
a controller configured to control the coupling factor and an output power of each of the plurality of laser light sources,
wherein the controller sets the plurality of laser light sources at a minimum power consumption setting, and adjusts the coupling factor of the at least one optical coupling device.

2. The optical amplifying apparatus according to claim 1, wherein the at least one optical coupling device includes a plurality of optical coupling devices, and
the controller controls the coupling factor of each of the plurality of optical coupling devices.

3. The optical amplifying apparatus according to claim 1, wherein the gain medium is a core included in a multicore fiber, and
each of the plurality of laser light sources directly excites the gain medium by each of the plurality of excitation light beams.

4. The optical amplifying apparatus according to claim 1, wherein the gain medium is a multicore fiber,
each of the plurality of laser light sources excites the gain medium by pumping a clad of the multicore fiber, and
each of the plurality of excitation light beams is a multimode light beam.

5. The optical amplifying apparatus according to claim 1, wherein a number of the plurality of optical amplifiers is represented by a positive integer N, a number of the at least one optical coupling devices is represented by a positive integer M, and a number of the plurality of laser light sources is represented by a positive integer L, where N, M, and L satisfy one or more relational expressions of $$N \geq 2,\ (N/2) \leq M \leq (N^2/4),\ \text{and}\ L \leq 2 \times M.$$

6. The optical amplifying apparatus according to claim 5, wherein the relational expression of $L=N=M^2/4$ is satisfied.

7. The optical amplifying apparatus according to claim 5, wherein the relational expression of $L=N=M/2$ is satisfied.

8. The optical amplifying apparatus according to claim 1, wherein the at least one optical coupling device is a tunable optical coupler including:
two input fibers;
two output fibers; and
two coupling fibers having cores that are configured to perform evanescent coupling, and
the controller controls the coupling factor by displacing the two coupling fibers.

9. The optical amplifying apparatus according to claim 1, wherein the at least one optical coupling device includes:
a polarization beam combiner configured to combine orthogonally the plurality of laser beams with linear polarization;
a polarization controller configured to rotate a polarization of a light beam output by the polarization beam combiner; and
a polarization beam splitter configured to split a light beam output by the polarization controller, and
the controller controls the coupling factor by controlling the polarization controller.

10. The optical amplifying apparatus according to claim 1, wherein the at least one optical coupling device includes a Mach-Zehnder interferometer including:
an interferometer structure having first and second arms; and
a heater that is placed on the first arm of the interferometer structure and tunes a difference in phase between both the first and the second arms of the interferometer structure, and
the controller controls the coupling factor by controlling the heater.

11. The optical amplifying apparatus according to claim 1, wherein each of the plurality of laser light sources is an identical type of laser light source.

12. The optical amplifying apparatus according to claim 1, wherein the plurality of laser light sources include more than one type of laser light sources and have different specifications.

13. A method of amplifying an optical signal, comprising:
generating a plurality of laser beams;
coupling the plurality of laser beams variably in accordance with a coupling factor and generating a plurality of excitation light beams;
exciting, by the plurality of excitation light beams, a plurality of gain mediums through which a plurality of optical signals passing;
controlling the coupling factor and an output power of each of the plurality of laser beams; and
setting the plurality of laser beams at a minimum power consumption setting, and
adjusting the coupling factor.

14. The method of amplifying the optical signal according to claim 13,
wherein the controlling of the coupling factor and the output power includes:
monitoring an output level of an optical signal having passed through each of the plurality of gain mediums;
calculating a ratio of the output level to a target value; and
controlling the coupling factor so as to make the ratio for one of the plurality of gain mediums equal to the ratio for another of the plurality of gain mediums.

15. The method of amplifying the optical signal according to claim 14,
wherein the controlling of the coupling factor and the output power includes;
evaluating efficiency for generating each of the plurality of laser beams;
decreasing an optical power of the laser beam having a lowest efficiency when the output level is greater than the target value; and
increasing an optical power of the laser beam having a highest efficiency when the output level is less than the target value.

16. The method of amplifying the optical signal according to claim 15,
wherein decreasing the optical power and increasing the optical power are performed after calculating the ratio and controlling the coupling factor.

17. The method of amplifying the optical signal according to claim 15,
wherein decreasing the optical power and increasing the optical power are performed before calculating the ratio and controlling the coupling factor.

18. The method of amplifying the optical signal according to claim 13,
wherein the plurality of gain mediums are controlled in an auto power control manner, in accordance with an output signal power output from each of the plurality of gain mediums.

19. The method of amplifying the optical signal according to claim 13,
wherein the plurality of gain mediums are controlled in an auto gain control manner, in accordance with an input signal power inputted into each of the plurality of gain mediums and an output signal power output from each of the plurality of gain mediums.

20. The method of amplifying the optical signal according to claim 13,
wherein the plurality of gain mediums are controlled in an auto current control manner, in accordance with currents to generate the plurality of laser beams.

* * * * *